United States Patent
Ukigaya

(10) Patent No.: US 12,075,669 B2
(45) Date of Patent: Aug. 27, 2024

(54) ORGANIC LIGHT-EMITTING DEVICE, DISPLAY APPARATUS, PHOTOELECTRIC CONVERSION APPARATUS, ELECTRONIC APPARATUS, ILLUMINATING APPARATUS, AND MOVING OBJECT

(71) Applicant: CANON KABUSHIKI KAISHA, Tokyo (JP)

(72) Inventor: Nobutaka Ukigaya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 327 days.

(21) Appl. No.: 17/470,660

(22) Filed: Sep. 9, 2021

(65) Prior Publication Data

US 2022/0085135 A1    Mar. 17, 2022

(30) Foreign Application Priority Data

Sep. 14, 2020 (JP) .................................. 2020-153485

(51) Int. Cl.
*H10K 59/131* (2023.01)
*H10K 59/88* (2023.01)

(52) U.S. Cl.
CPC ........... *H10K 59/131* (2023.02); *H10K 59/88* (2023.02)

(58) Field of Classification Search
CPC ............................. H10K 59/88; H10K 59/131
See application file for complete search history.

(56) References Cited

U.S. PATENT DOCUMENTS

| 2016/0260782 | A1 | 9/2016 | Min | |
|---|---|---|---|---|
| 2020/0013834 | A1* | 1/2020 | Park | H10K 50/844 |
| 2020/0201127 | A1* | 6/2020 | Hara | G02F 1/13439 |
| 2022/0326558 | A1* | 10/2022 | Long | G02F 1/136286 |

FOREIGN PATENT DOCUMENTS

| JP | 2005148335 A | 6/2005 |
|---|---|---|
| JP | 2008145834 A | 6/2008 |
| JP | 2010027584 A | 2/2010 |

* cited by examiner

*Primary Examiner* — Douglas M Menz
(74) *Attorney, Agent, or Firm* — Canon U.S.A., Inc. I.P. Division

(57) ABSTRACT

An organic light-emitting device includes a display region, a non-display region disposed around the display region, a first organic light-emitting element disposed on a substrate and included in the display region, and a second organic light-emitting element disposed on the substrate and included in the non-display region. The first organic light-emitting element and the second organic light-emitting element each include, in an order from a side of the substrate, a first electrode, an organic layer including a light emitting layer, and a second electrode. The light emitting layer is common to and extends across the first organic light-emitting element and the second organic light-emitting element. A light-emitting threshold voltage for the second organic light-emitting element is higher than a light-emitting threshold voltage for the first organic light-emitting element.

25 Claims, 14 Drawing Sheets

ORGANIC LIGHT-EMITTING DEVICE, DISPLAY APPARATUS, PHOTOELECTRIC CONVERSION APPARATUS, ELECTRONIC APPARATUS, ILLUMINATING APPARATUS, AND MOVING OBJECT

BACKGROUND

Field of the Disclosure

The present disclosure relates to an organic light-emitting device, a display apparatus, a photoelectric conversion apparatus, an electronic apparatus, an illuminating apparatus, and a moving object.

Description of the Related Art

An organic light-emitting element includes a negative electrode, a positive electrode, and an organic compound layer interposed between the positive and the negative electrodes. The organic light-emitting element serves as a light emitting device in which electrons injected from the negative electrode and holes injected from the positive electrode are recombined to emit light. The organic light-emitting element is a lightweight device capable of being configured as a flexible device. Therefore, organic light-emitting devices, such as display apparatuses, including organic light-emitting elements have attracted attention in recent years.

An organic light-emitting device includes a two-dimensional array of organic light-emitting elements disposed on a substrate. Japanese Patent Laid-Open No. 2005-148335 discloses a display apparatus that includes a display region and a non-display region formed around the perimeter of the display region. The display region has therein a two-dimensional array of many pixels contributing to displaying an image, and the non-display region has therein a plurality of dummy pixels similar in structure to the pixels but not contributing to displaying an image.

Typically, an organic light-emitting element disposed in a dummy pixel in the non-display region (hereinafter also referred to as a dummy region) is configured not to emit light during display of an image in the display region. However, if a voltage is accidentally applied across electrodes of the organic light-emitting element in the dummy pixel, the resulting flow of current through an organic compound layer leads to accidental light emission. In the event of accidental light emission in the dummy region, light emission unrelated to the displayed image occurs around the display region, and this leads to degradation in display quality.

SUMMARY

In view of the problem described above, the present disclosure provides an organic light-emitting device that can achieve high-quality light emission.

An organic light-emitting device includes a display region, a non-display region disposed around the display region, a first organic light-emitting element disposed on a substrate and included in the display region, and a second organic light-emitting element disposed on the substrate and included in the non-display region. The first organic light-emitting element and the second organic light-emitting element each include, in an order from a side of the substrate, a first electrode, an organic layer including a light emitting layer, and a second electrode. The light emitting layer is common to and extends across the first organic light-emitting element and the second organic light-emitting element. A light-emitting threshold voltage for the second organic light-emitting element is higher than a light-emitting threshold voltage for the first organic light-emitting element.

Further features of the present disclosure will become apparent from the following description of exemplary embodiments with reference to the attached drawings.

DESCRIPTION OF THE EMBODIMENTS

Figure 1:
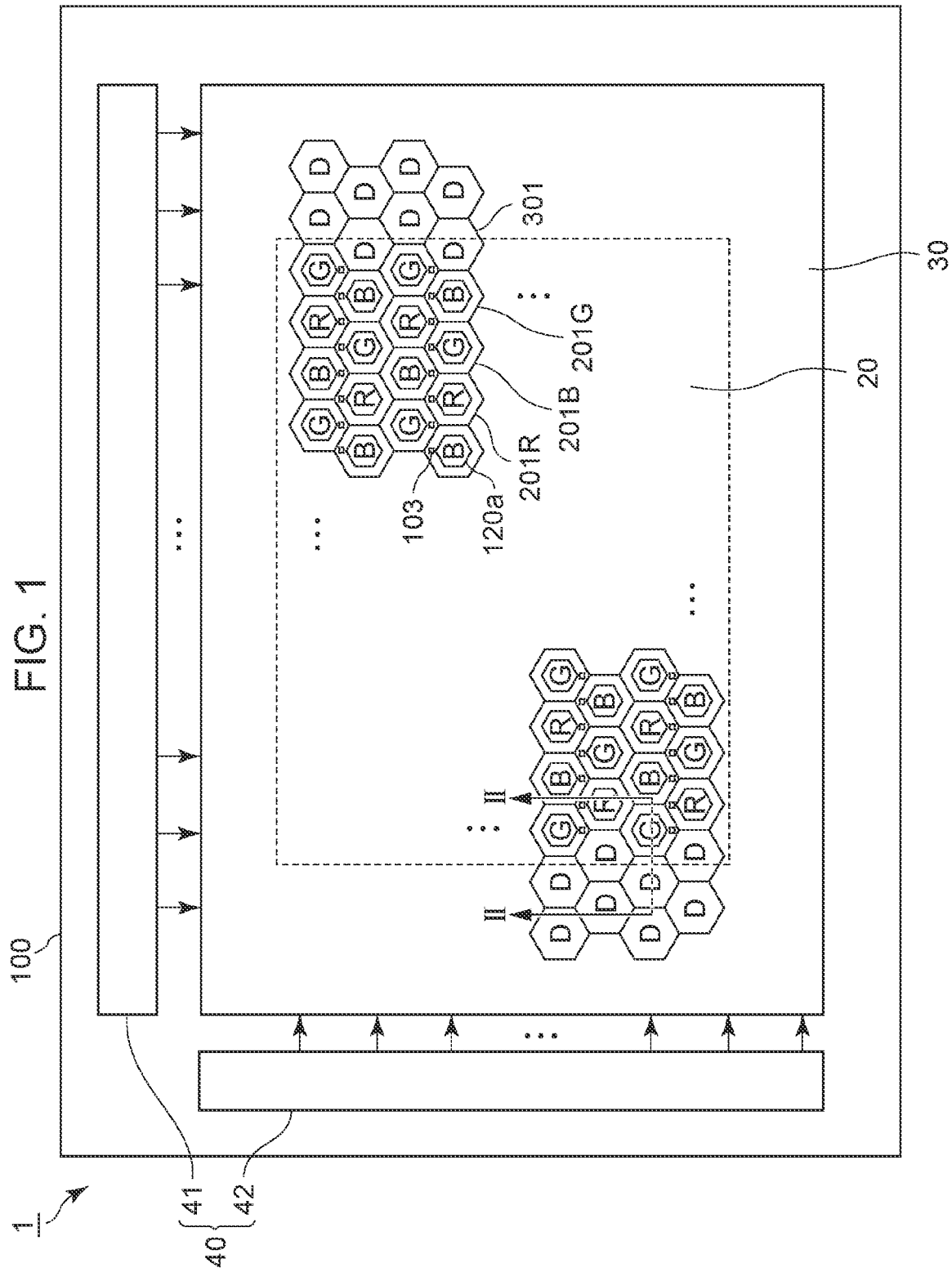
FIG. 1 is a plan view illustrating a configuration of a light emitting device according to a first embodiment.

Organic light-emitting devices according to embodiments will now be described in detail with reference to the attached drawings. The following embodiments are merely examples of the present disclosure. Numerical values, shapes, materials, constituent elements, and the arrangement and modes of connection of the constituent elements described herein are not intended to limit the present disclosure. Although a plurality of features are described in the embodiments, not all the features are essential to the disclosure, and the features may be combined as appropriate. In the attached drawings, the same or similar components are assigned the same reference numerals and redundant description will be omitted.

First Embodiment

A light emitting device according to a first embodiment of the present disclosure will now be described with reference to FIGS. 1 to 4D.

(Overall Configuration)

FIG. 1 is a plan view illustrating a configuration of a light emitting device 1 according to the present embodiment. The light emitting device 1 includes a display region 20 for displaying an image, and a dummy region 30 not displaying an image. The display region 20 has a plurality of light emitting elements 201 (201R, 201G, and 201B) arranged therein, and the dummy region 30 has a plurality of dummy elements 301 arranged therein. The light emitting elements 201 and the dummy elements 301 are arranged in a two-dimensional array on a substrate 100. The plurality of light emitting elements 201 arranged in the display region 20 constitute respective display pixels, and the plurality of dummy elements 301 arranged in the dummy region 30 constitute respective dummy pixels.

In the display region 20, the light emitting elements 201 are driven to emit light to display an image. Although the dummy elements 301 arranged in the dummy region 30 are similar in structure to the light emitting elements 201 arranged in the display region 20, the dummy elements 301 do not contribute to displaying an image. The dummy elements 301 do not need to emit light. For example, the dummy elements 301 may be arranged to reduce reflection of light in an area outside the display region 20, and may have a reflective electrode structure similar to that in the display region 20. The dummy elements 301 do not contribute to displaying an image, but may be used as pixels for correcting an output image, or as pixels for in-process inspection.

The outer edge of the display region 20 may be defined by the outer edges of the outermost ones of the plurality of light emitting elements 201 that actually emit light for displaying an image (e.g., white image). Alternatively, as illustrated in FIG. 1, the outer edge of the display region 20 may be defined by a substantially rectangular outline that connects the outer edges of the outermost ones of the plurality of light emitting elements 201 that actually emit light. The display region 20 is also referred to as an effective pixel region.

The plurality of light emitting elements 201 in the display region 20 include red light emitting elements 201R emitting red light, green light emitting elements 201G emitting green light, and blue light emitting elements 201B emitting blue light. The light emitting elements 201R, 201G, and 201B of these three colors are arranged adjacent to each other on the substrate 100, and the three light emitting elements 201R, 201G, and 201B constitute each pixel. The pixels are arranged in a two-dimensional array to form the display region 20, in which any image can be displayed in full color. The three light emitting elements 201R, 201G, and 201B constituting each pixel correspond to red, green, and blue sub-pixels, respectively.

As illustrated in FIG. 1, the light emitting elements 201 are arranged in a delta arrangement on the substrate 100. The light emitting elements 201 are organic light-emitting elements, as described below. Adjacent ones of the light emitting elements 201 emit light of different colors. Referring to FIG. 1, symbols R, G, and B in hexagons, each representing a pixel, denote red, green, and blue pixels, respectively, in the display region 20, whereas symbol D in hexagons denotes a dummy pixel.

The pixel arrangement presented here is merely an example and is not particularly limited to this. For example, the pixel arrangement may be a stripe arrangement, a mosaic arrangement, or a PenTile arrangement. Although the pixels of all the colors in this example are equal in area (i.e., the area of a light emitting region defined by an opening 120a in a second insulating layer 120, described below), the area of pixels may be varied from one color to another by taking into account, for example, the resolution or luminous efficiency of the light emitting device 1. Although the pixels are hexagonal in this example, the shape of the pixels is not particularly limited. The pixels may have a quadrangular shape, such as a square or rectangular shape, another polygonal shape, or a circular or elliptical shape. Also, sub-pixel and pixel pitches are not particularly limited. In the present embodiment, the sub-pixel pitch is about 5 μm and the pixel pitch is about 8 μm.

Although three sub-pixels constitute each pixel in this example, the number of sub-pixels constituting each pixel does not necessarily need to be three, and may be appropriately selected in accordance with the resolution or display efficiency of the light emitting device serving as a display. For example, each pixel may include two green sub-pixels, so that each pixel is constituted by four sub-pixels. Each pixel may include a white sub-pixel as well as the sub-pixels of the three colors described above, so that each pixel is constituted by four sub-pixels.

(Circuits)

The light emitting device 1 further includes a peripheral circuit 40. The peripheral circuit 40 may include a signal-line drive circuit 41 (signal output circuit) and a signal-line drive circuit 42 (vertical scanning circuit) that serve as drivers for image display. Although the dummy region 30 and the peripheral circuit 40 are illustrated as not overlapping in plan view of FIG. 1, the layout is not limited to this. For example, the dummy region 30 and the peripheral circuit 40 may be arranged in such a way that the dummy region 30 overlaps part of the peripheral circuit 40 in plan view. In the present specification, the term "plan view" refers to a view of an object when seen in a direction orthogonal to the principal plane of the substrate 100.

Although the dummy region 30 is disposed to surround the display region 20 in FIG. 1, the dummy region 30 does not necessarily need to surround the display region 20. For example, the display region 20 may be partially surrounded by the dummy region 30.

A pixel drive circuit (not shown) is provided in the display region 20. The pixel drive circuit is an active-matrix drive circuit provided in a layer below a first electrode 110 (described below). The light emitting device 1 may therefore be considered as an active-matrix display device. A known configuration may be adopted as the configuration of the pixel drive circuit. Although the pixel drive circuit is not provided in the dummy region 30 in the present embodiment, the present disclosure is not limited to this. The pixel drive circuit may be provided in at least part of the dummy region 30.

The pixel drive circuit includes, for example, a drive transistor, a writing transistor, and a holding capacitor for each pixel. The pixel drive circuit has a structure in which any organic light-emitting element (light emitting element 201) to be driven is connected in series to the drive transistor between a first power line (Vcc) and a second power line (Vgnd). One electrode of the holding capacitor is connected between the drive transistor and the writing transistor, and the other electrode of the holding capacitor is connected to the first power line Vcc.

The pixel drive circuit has a plurality of signal lines extending in the column direction and a plurality of scanning lines extending in the row direction. Each intersection of a signal line and a scanning line corresponds to one of the light emitting elements 201. Each signal line is connected to the signal-line drive circuit 41 of the peripheral circuit 40, and an image signal is supplied from the signal-line drive circuit 41 through the signal line to the source electrode of the writing transistor. Each scanning line is connected to the signal-line drive circuit 42 of the peripheral circuit 40, and a scanning signal is sequentially supplied from the signal-line drive circuit 42 through the scanning line to the gate electrode of the writing transistor.

Each light emitting element 201 in the display region 20 includes a plug 103 for electrical connection to the pixel drive circuit. The light emitting element 201 in the display region 20 has the opening 120a in the second insulating layer 120 (described below) for defining the light emitting region. The details will be described later on below. On the other hand, in the present embodiment, the dummy element 301 has neither the plug 103 nor the opening 120a in the second insulating layer 120.

(Configuration of Base Layer of Light Emitting Element and Dummy Element)

Figure 2:
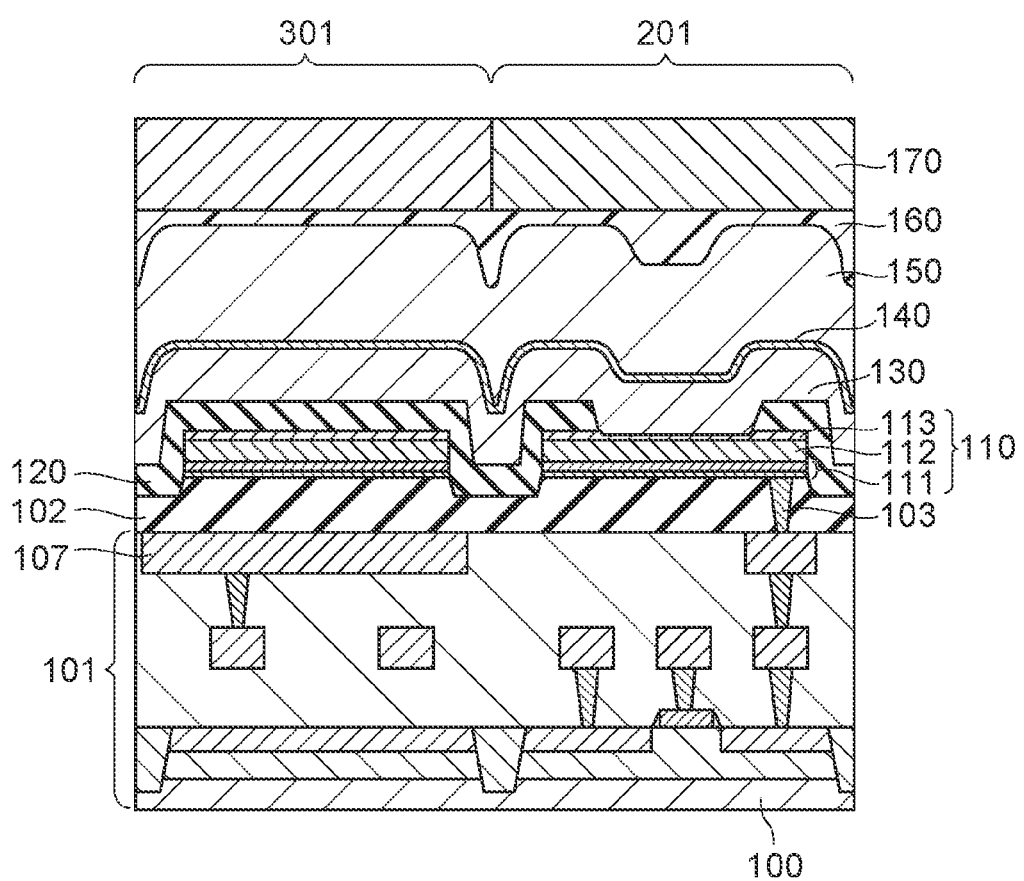
FIG. 2 is a cross-sectional schematic view of the light emitting device according to the first embodiment.

A configuration of a base layer of the light emitting element 201 and the dummy element 301 of the light emitting device 1 will now be described. FIG. 2 is a cross-sectional schematic view taken along line II-II in FIG. 1.

As illustrated in FIG. 2, a drive circuit layer 101 is disposed on the substrate 100. The drive circuit layer 101 includes at least one or more transistors, one or more capacitors, and one or more wiring layers. Although the drive circuit layer 101 includes two wiring layers in this example, the number of wiring layers is not particularly limited. Also, the line width and the film thickness of each of the wiring layers (e.g., one wiring layer adjacent to the substrate 100 and the other wiring layer disposed on the one wiring layer) are not particularly limited, and may be appropriately selected as required. For example, as compared to a wire connected via a plug to a microscopic transistor on the substrate 100, a wire in an upper layer may have a greater line width or a greater film thickness.

An interlayer insulating layer 102 (first insulating layer) is disposed on the drive circuit layer 101. The interlayer insulating layer 102 may be planarized. The light emitting element 201 and the dummy element 301 are disposed on the interlayer insulating layer 102.

The interlayer insulating layer 102, which is provided with a microscopic connection hole, may be made of a material that can be processed with high precision. The plug 103 made of a conductive metal is inserted into the connection hole in the interlayer insulating layer 102. The transistor in the drive circuit layer 101, included in the pixel drive circuit, is electrically connected through the plug 103 to the first electrode 110 of the light emitting element 201 in the display region 20. The interlayer insulating layer 102 may be made of an organic material, such as acrylic or polyimide, or an inorganic material, such as silicon oxide (SiOx), silicon nitride (SiNx), or silicon oxynitride (e.g., SiON). In the present embodiment, a power supply line 107 not connected to the first electrode 110 is disposed below the first electrode 110 of the dummy element 301. The interlayer insulating layer 102 is interposed between the power supply line 107 and the first electrode 110 of the dummy element 301. The details will be described later on below.

(Configuration Common to Light Emitting Element and Dummy Element)

Figure 3:
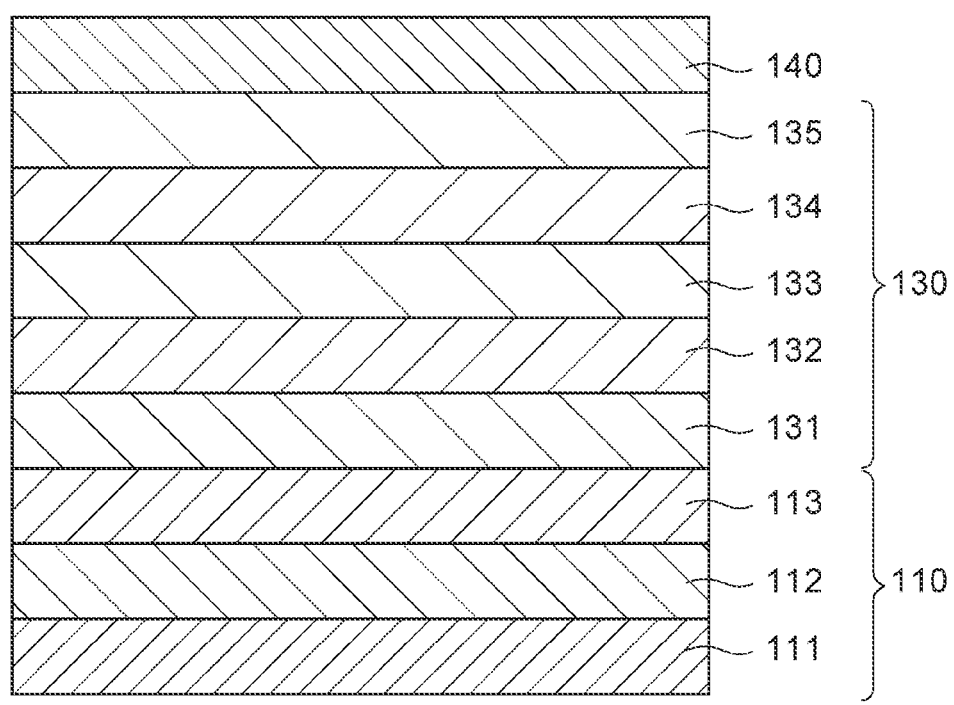
FIG. 3 is a schematic cross-sectional view illustrating a layer structure of a light emitting element and a dummy element according to the first embodiment.

Next, the configuration common to the light emitting element 201 and the dummy element 301 of the light emitting device 1 will be described with reference to FIG. 2 and FIG. 3. FIG. 3 is a schematic cross-sectional view illustrating a layer structure of the light emitting element 201 and the dummy element 301. As illustrated in FIG. 2 and FIG. 3, the light emitting element 201 and the dummy element 301 each include, in order from a side of the substrate 100, the first electrode 110 disposed on the interlayer insulating layer 102, an organic layer 130 including a light emitting layer 133, and a second electrode 140. The second insulating layer 120 is disposed to cover an end portion of the first electrode 110.

A sealing layer 150 and a planarizing layer 160 are disposed on the second electrode 140. Although the sealing layer 150 and the planarizing layer 160 are illustrated as different layers in FIG. 2, they may be combined to form a single layer. The sealing layer 150 may have a multilayer structure including a plurality of sublayers. A color filter 170 (170R, 170G, and 170B) that transmits light of different colors, pixel by pixel, is disposed on the planarizing layer 160. This enables the light emitting device 1, for example, to display in full color. In the present embodiment, the color filter 170 is also provided in the dummy region 30. The color filter 170 is disposed on the planarizing layer 160 of the dummy element 301.

The first electrode 110 is an anode (positive electrode), which is disposed in each of the light emitting element 201 and the dummy element 301 in an electrically isolated manner. In other words, the first electrode 110 is disposed in each sub-pixel in an electrically isolated manner. The first electrode 110 is also called a lower electrode, a pixel electrode, or a discrete electrode. In the present embodiment, the first electrode 110 has a multilayer structure including, in order from the side of the interlayer insulating layer 102, a barrier metal layer 111, a reflective metal layer 112, and a light transmitting electrode 113. The first electrode 110 also serves as a reflective layer. The luminous efficiency of the light emitting element 201 is improved by increasing the reflectivity of the first electrode 110. The thickness of the first electrode 110 is not particularly limited, but is, for example, greater than or equal to 30 nm and less than or equal to 1000 nm.

The barrier metal layer 111 is provided to reduce diffusion of a metal element (e.g., aluminum) contained, for example, in the reflective metal layer 112, toward the substrate 100. The barrier metal layer 111 may be formed either by a single layer or a plurality of sublayers. For example, the barrier metal layer 111 may have a multilayer structure including, in order from the side of the interlayer insulating layer 102, a titanium (Ti) layer having a thickness of greater than or equal to 10 nm and less than or equal to 100 nm and a titanium nitride (TiN) layer having a thickness of greater than or equal to 10 nm and less than or equal to 100 nm.

The reflective metal layer 112 is provided to reflect light emitted from the light emitting layer 133 and cause the reflected light to exit from a side opposite the substrate 100. The reflective metal layer 112 may have a light reflectivity of 70% or higher in a visible light range. For example, aluminum (Al), silver (Ag), or an alloy containing them may be used to form the reflective metal layer 112.

The reflective metal layer 112 may have a film thickness of 50 nm or more to improve reflectivity. However, if the film thickness of the reflective metal layer 112 is too large, the resulting increase in the surface roughness of the reflective metal layer 112 and the resulting creation of a step at the end portion of the first electrode 110 may cause step disconnection or high resistance in the organic layer 130 or the second electrode 140. The maximum thickness of the reflective metal layer 112 may therefore be determined so as to avoid such problems. For example, the film thickness of the first electrode 110 may be smaller than the film thickness of the organic layer 130 interposed between the first electrode 110 and the second electrode 140.

The light transmitting electrode 113 is a transparent layer disposed on the reflective metal layer 112. The light transmitting electrode 113 is used, for example, to ensure efficiency of hole injection (or performance of carrier injection) into the organic layer 130 disposed on the first electrode 110, or to adjust the optical path length. When, for example, aluminum or an aluminum alloy is used to form the reflective metal layer 112, its low work function and its susceptibility to surface oxidation may reduce the efficiency of hole injection if the organic layer 130 is directly formed on the reflective metal layer 112. By providing the light transmitting electrode 113 on the reflective metal layer 112, therefore, the efficiency of hole injection from the first electrode 110 into the organic layer 130 is improved. The light transmitting electrode 113 may be a layer with low electrical resistance, which may be lower than the electrical resistance of a coating (e.g., oxide film) that can be formed on the surface of the reflective metal layer 112. The light transmitting electrode 113 may be formed, for example, by a thin film of a material appropriately selected from high melting metals, such as Ti, tungsten (W), molybdenum (Mo), chromium (Cr), tantalum (Ta), and an alloy of these metals, or from transparent conductive oxides, such as indium tin oxide (ITO), indium zinc oxide (IZO), aluminum zinc oxide (AZO), and indium gallium zinc oxide (IGZO). When a high melting metal, such as Ti, is used to form the light transmitting electrode 113, the light transmitting electrode 113 may have a film thickness of 50 nm or less to reduce a decrease in the reflectivity of the first electrode 110.

The second insulating layer 120 is disposed over the first electrode 110 and the interlayer insulating layer 102 to cover the end portion of the first electrode 110. The second insulating layer 120 has the function of reducing leak current between adjacent ones of the first electrodes 110, and also reducing leak current between the first electrode 110 and the second electrode 140. In the light emitting element 201, as described below, the second insulating layer 120 has the opening 120a, which exposes a center portion of the first electrode 110 and defines the light emitting region of the light emitting element 201. The second insulating layer 120 is also called a pixel separation film, a partition, or a bank.

The organic layer 130 is disposed over the first electrode 110 and the second insulating layer 120 as a layer common to the plurality of light emitting elements 201 and dummy elements 301. In other words, the organic layer 130 extends across the plurality of light emitting elements 201 and dummy elements 301. The organic layer 130 may also be described as a layer common to, and extending across, a plurality of sub-pixels. The organic layer 130 is composed of a plurality of sublayers including the light emitting layer 133. At least some sublayers of the organic layer 130 may be patterned in units of one or more light emitting elements 201 or one or more dummy elements 301.

Examples of the plurality of sublayers of the organic layer 130 include a hole injection layer, a hole transport layer, an electron block layer, a light emitting layer, a hole block layer, and an electron transport layer. In the organic layer 130, holes injected from the first electrode 110 (positive electrode) and electrons injected from the second electrode 140 (negative electrode) are recombined in the light emitting layer 133 to emit light. The light emitting layer 133 may be formed either by a single layer or a plurality of sublayers. The light emitting layer 133 may contain a red light-emitting material, a green light-emitting material, and a blue light-emitting material, and is capable of mixing different emission colors to produce white light. The light emitting layer 133 may contain light emitting materials of complementary colors, such as a blue light-emitting material and a yellow light-emitting material. In the present embodiment, the light emitting layer 133 is common to and extends across the plurality of light emitting elements 201 and dummy elements 301. Any types and materials of the sublayers of the organic layer 130 may be selected from known ones and used.

The light emitting device 1 of the present embodiment is of a so-called "white color+color filter (CF) type" in which white light emitted from the light emitting layer 133 passes through the color filter 170 (described below) to produce red light, green light, or blue light. The present disclosure is not limited to this. The light emitting device 1 may be of a so-called "RGB patterning type" in which a material (light emitting material) forming the light emitting layer 133 is varied from one light emitting element to another and elements emitting red, green, and blue light are arranged on the substrate 100. Although the light emitting layer 133 is patterned for each light emitting element in the "RGB patterning type", at least one of the plurality of sublayers of the organic layer 130, except the light emitting layer 133, may be common to and extend across a plurality of light emitting elements.

In the present embodiment, as illustrated in FIG. 3, the organic layer 130 has a multilayer structure that includes, in order from the side of the first electrode 110, a hole injection layer 131, a hole transport layer 132, the light emitting layer 133, an electron transport layer 134, and an electron injection layer 135. The light emitting layer 133 contains a red light-emitting material, a green light-emitting material, and a blue light-emitting material, and mixes the emission colors to emit white light. The light emitting element 201 according to the present embodiment is a so-called top-emission light emitting element in which light produced in the organic layer 130 exits from the side of the second electrode 140.

The second electrode 140 is a cathode (negative electrode) formed on the organic layer 130 as an electrode common to the plurality of light emitting elements 201 and dummy elements 301. In other words, the second electrode 140 extends across the plurality of light emitting elements 201 and dummy elements 301. The second electrode 140 may also be described as an electrode extending across a plurality of sub-pixels. The second electrode 140 is a light-transmitting conductive film. The second electrode 140 may be made of a semi-transmissive material having the property of transmitting part of light reaching the surface thereof and reflecting the other part of the light (i.e., semi-transmissive reflectivity). The second electrode 140 may be made of a transparent conductive oxide, such as ITO, IZO, zinc oxide (ZnO), AZO, or IGZO. The second electrode 140 may be made of a single metal, such as Al, Ag, or Au, an alkali metal, such as lithium (Li) or cesium (Cs), an alkaline earth metal, such as magnesium (Mg), calcium (Ca), or barium (Ba), or a semi-transmissive material containing these metal materials. For example, a semi-transmissive material used to form the second electrode 140 may be an alloy mainly composed of Mg or Ag. The second electrode 140 may be a multilayer structure of the materials described above.

Although the first electrode 110 and the second electrode 140 are an anode and a cathode, respectively, in the present embodiment, the first electrode 110 and the second electrode 140 may be a cathode and an anode, respectively. While not shown, in an area around the pixel region including the display region 20 and the dummy region 30, the second electrode 140 is electrically connected to a wiring layer included in the drive circuit layer 101. To make the film thickness of the second electrode 140 thinner to increase the light transmittance of the second electrode 140, the second electrode 140 may be electrically connected to the wiring layer included in the drive circuit layer 101 in the pixel region by taking into account that the sheet resistance of the second electrode 140 becomes relatively high.

The sealing layer 150 is provided on the second electrode 140 as a layer common to the plurality of light emitting elements 201 and dummy elements 301. The sealing layer 150 is formed to cover the organic layer 130 including the light emitting layer 133. The sealing layer 150 may contain a light-transmitting inorganic material having low permeability to external oxygen or moisture. The sealing layer 150 may be made of an inorganic material, such as SiOx, SiNx, SiON, aluminum oxide (e.g., $Al_2O_3$), or titanium oxide (e.g., $TiO_2$). The sealing layer 150 may be formed by chemical vapor deposition (CVD), atomic layer deposition (ALD), or sputtering. The sealing layer 150 may either have a single layer structure or a multilayer structure formed by combining the materials and techniques described above, as long as it is capable of fully blocking moisture.

The planarizing layer 160 is disposed on the sealing layer 150 to planarize the upper surface of the sealing layer 150. The planarizing layer 160 may be made of any light transmitting material, either an inorganic material or an organic material. For example, the planarizing layer 150 may be formed by application of an organic material.

The color filter 170 is disposed on the planarizing layer 160. The color filters 170R, 170G, and 170B are color filters that transmit different colors. The color filters 170R, 170G, and 170B are each configured to extract light produced in the light emitting element 201 as red light, green light, or blue light for each sub-pixel. In a color filter pattern where color filters transmitting different colors are arranged to be adjacent to each other, adjacent color filters may be provided with a light shield therebetween to prevent color mixture between pixels.

While not shown, microlenses may be used to enable efficient extraction of light emitted in the organic layer 130. For example, a two-dimensional microlens array including a plurality of microlenses may be disposed on the color filter 170 in such a manner that each microlens corresponds to either the light emitting element 201 or the dummy element 301.

Although the sealing layer 150 has the planarizing layer 160 formed thereon and the planarizing layer 160 has the color filter 170 formed thereon in this example, the configuration is not limited to this. For example, the substrate 100 may be bonded to another substrate (second substrate) having the color filter 170 formed thereon. In this case, the sealing layer 150 can be provided on the second substrate, and thus does not need to be added onto the second electrode 140.

(Differences in Configuration between Light Emitting Element and Dummy Element)

Differences in configuration between the light emitting element 201 and the dummy element 301 will now be described with reference to FIGS. 1 and 2.

First, the light emitting element 201 and the dummy element 301 differ in the shape of the second insulating layer 120. As described above, the second insulating layer 120 of the light emitting element 201 has the opening 120a, which exposes the center portion of the first electrode 110. Thus, in the light emitting element 201, the first electrode 110 is covered with the second insulating layer 120 at the end portion thereof, and is in contact with the organic layer 130 in the center portion thereof. On the other hand, the second insulating layer 120 of the dummy element 301 does not have the opening 120a, and one side (upper surface) of the first electrode 110 adjacent to the light emitting layer 133 is entirely covered with the second insulating layer 120. Accordingly, in the dummy element 301, the first electrode 110 is not in direct contact with the organic layer 130.

Second, the first electrode 110 of the light emitting element 201 is electrically connected by the plug 103 to the drive circuit layer 101. However, the first electrode 110 of the dummy element 301 is not provided with the plug 103 thereunder and thus is not electrically connected to the drive circuit layer 101. That is, the first electrode 110 of the dummy element 301 is electrically floated. Accordingly, the dummy element 301 is not an element that emits light when accidentally driven by the drive circuit layer 101, and basically does not emit light.

(Manufacturing Method)

A method for manufacturing the light emitting device 1 according to the present embodiment will now be described. FIGS. 4A to 4D are schematic diagrams illustrating an exemplary process of manufacturing the light emitting device 1 according to the present embodiment. In the following description, an object to be processed in each step may be simply referred to as "substrate". That is, even when one or more layers formed in the preceding steps are already on the substrate 100, the substrate 100 and the one or more layers thereon may be collectively referred to as "substrate".

Figure 4A:
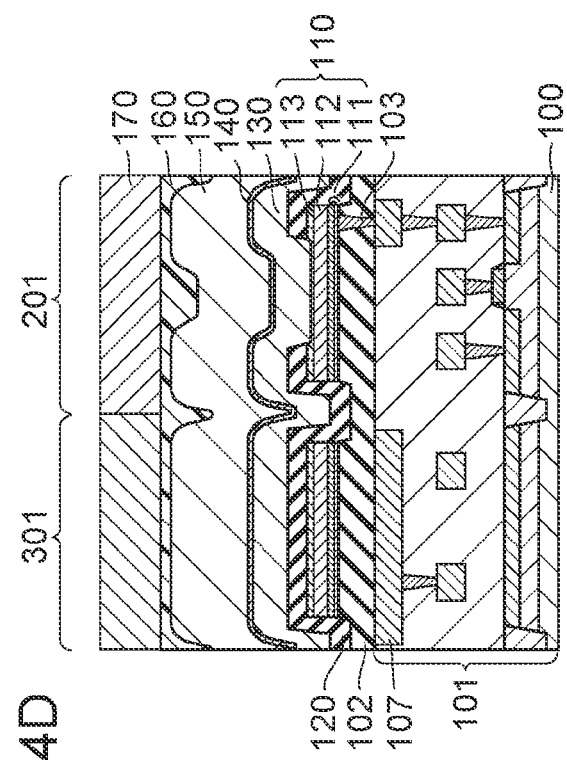
FIGS. 4A to 4D are schematic diagrams illustrating an exemplary process of manufacturing the light emitting device according to the first embodiment.

First, as illustrated in FIG. 4A, the drive circuit layer 101 including a pixel drive circuit is formed on the substrate 100. The drive circuit layer 101 is formed by producing various devices, such as transistors and capacitors, using a known metal oxide semiconductor (MOS) process.

Next, for example, by plasma CVD, high-density plasma, or a combination of these techniques, an insulating film, such as a silicon oxide (SiOx) film or a silicon oxynitride (SiON) film, is formed on the drive circuit layer 101 to produce the interlayer insulating layer 102. After forming the interlayer insulating layer 102, a surface including the pixel region may be planarized by chemical mechanical polishing (CMP).

Next, a plurality of holes are formed by photolithography and dry etching at predetermined positions in the interlayer insulating layer 102. Then, for example, a tungsten (W) film is formed over the holes, and the plug 103 made of a conductive material is formed in each of the holes by CMP or etch back.

Next, a laminated metal film including a Ti layer, a TiN layer, an aluminum alloy layer, and a Ti layer is sequentially formed, for example, by sputtering on the interlayer insulating layer 102. The laminated metal film is patterned into a predetermined shape by a combination of photolithography and dry etching or by wet etching to form, in the display region 20, a plurality of first electrodes 110 connected to the plugs 103. FIG. 4A illustrates the first electrodes 110, as well as other parts produced up to this point.

Next, an insulating layer, such as a SiOx film, a SiON film, or a SiNx film, is formed by plasma CVD on the surface including the first electrodes 110 to form the second insulating layer 120. The film-forming temperature of the second insulating layer 120 formed by direct deposition on the first electrodes 110 including an aluminum alloy layer, which is the reflective metal layer 112, may be 400° C. or below to reduce variation in the surface roughness of the aluminum alloy. The technique used to form the second insulating layer 120 is not limited to the plasma CVD described above, and any known technique for forming an insulating layer may be used. Examples of the technique include high-density plasma CVD, ALD, sputtering, or a coating method which involves applying a coating material using spin coating or slit coating to deposit a film. The second insulating layer 120 may be formed by stacking a plurality of layers.

Next, the second insulating layer 120 is patterned by photolithography and dry etching into a predetermined shape to form a plurality of openings 120a corresponding to the respective first electrodes 110 of the light emitting elements 201. At the same time, holes are formed to connect the second electrode 140 (formed in a subsequent step) to a metal layer at the same level as the first electrodes 110.

Figure 4B:
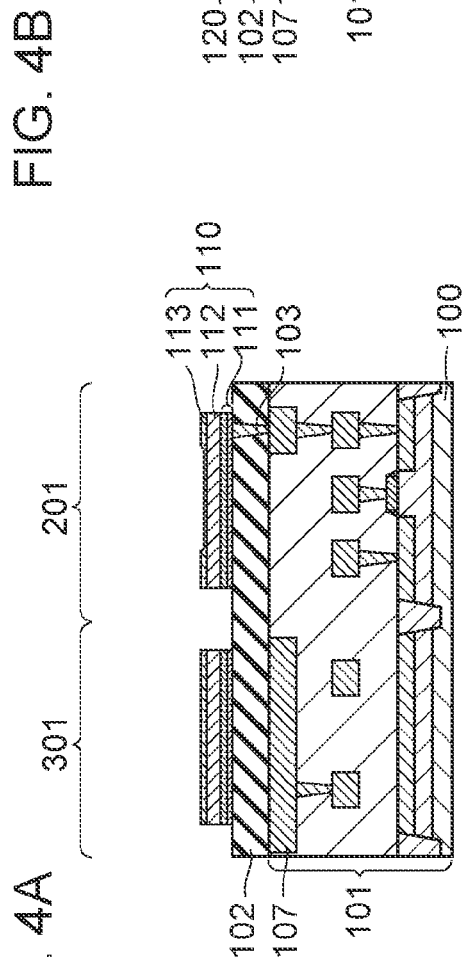

In the present embodiment, the opening 120a is not formed in the second insulating layer 120 on the first electrode 110 of the dummy element 301. Specifically, for exposure in photolithography, masks with different opening patterns are used for the display region 20 and the dummy region 30 (typically, a mask with no openings is used for exposure in the dummy region 30). Thus, the openings 120 in the second insulating layer 120 are selectively formed only in the display region 20. FIG. 4B illustrates the opening 120a formed in the second insulating layer 120, as well as other parts produced up to this point.

Next, the surface of the substrate is cleaned. This removes foreign matter on the substrate where the organic layer 130 is to be formed in the next step. The cleaning is followed by dehydrating the substrate to remove moisture from the surface of the substrate.

Figure 4C:
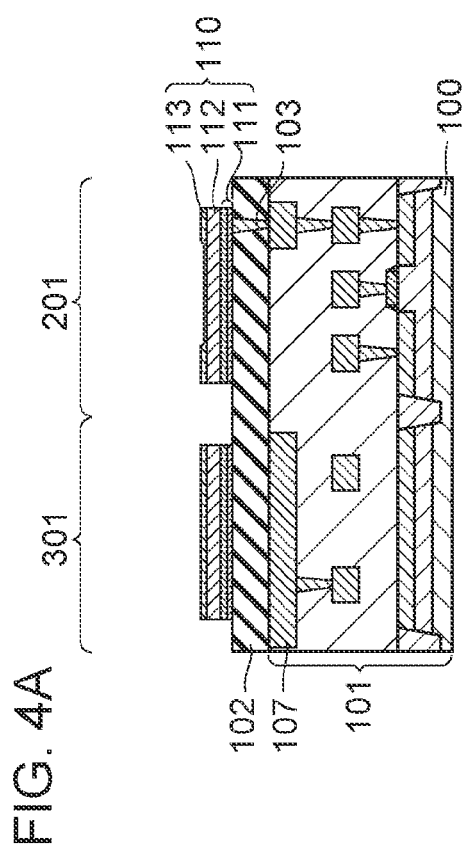

Next, as illustrated in FIG. 4C, the organic layer 130 and the second electrode 140 are formed. A plurality of sublayers of the organic layer 130 are sequentially deposited by vacuum deposition on the substrate to form the organic layer 130. Examples of the vacuum deposition technique include rotary deposition which involves forming a film using a point evaporation source (point source) while rotating the substrate, line deposition which involves forming a film using a line evaporation source (line source) while moving the evaporation source, and transfer deposition. After forming the organic layer 130, the second electrode 140 is also formed by vacuum deposition in vacuum atmosphere, without being open to ambient atmosphere. When the organic layer 130 and the second electrode 140 are formed by vacuum deposition, each material layer may be selectively deposited in desired regions by using a deposition mask (e.g., metal mask).

Next, for example, by plasma CVD, sputtering, ALD, or a combination of these techniques, the sealing layer 150 is formed on the second electrode 140 to cover the organic layer 130. The film-forming temperature of the sealing layer 150 may be lower than or equal to the decomposition temperatures of the organic materials forming the organic layer 130 and may be, for example, 120° C. or below. The organic layer 130, the second electrode 140, and the sealing layer 150 may all be continuously formed in vacuum atmosphere throughout the process, without being open to ambient atmosphere.

Next, the planarizing layer 160 is formed on the sealing layer 150. The planarizing layer 160 is formed by applying a resin material using a coating method, such as spin coating, slit coating, or bar coating, and curing the applied resin material.

Figure 4D:
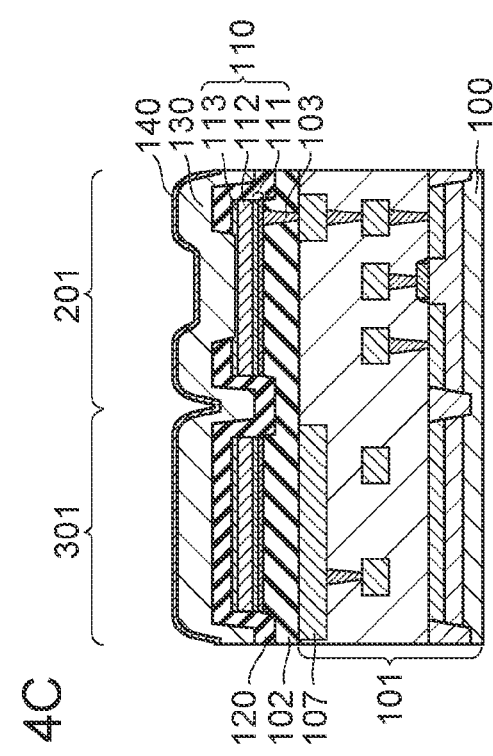

Next, the color filter 170 is formed on the planarizing layer 160. The color filter 170 is formed by sequentially forming filters of different colors. For example, the material of the red filter 170R is applied onto the substrate (or planarizing layer 160) and patterned by photolithography to form the red filter 170R. In the same manner as for the red filter 170R, the green filter 170G and the blue filter 170B are sequentially formed to produce the color filter 170. The processing temperature for forming the color filter 170 may be lower than or equal to the decomposition temperatures of the organic materials forming the organic layer 130, and may be, for example, 120° C. or below. FIG. 4D illustrates the color filter 170 as well as other parts produced up to this point.

Then, pads for terminals of the light emitting device 1 are formed by patterning into a predetermined shape by photolithography and dry etching.

Advantageous Effects of Present Embodiment

Advantageous effects achieved by the configuration of the light emitting device 1 according to the present embodiment will now be described.

As described above, in the light emitting device 1, the light emitting element 201 has the opening 120a in the second insulating layer 120, and the dummy element 301 does not have the opening 120a in the second insulating layer 120. That is, in the configuration where the substrate 100 has thereon a first organic light-emitting element (light emitting element 201) and a second organic light-emitting element (dummy element 301), a center portion of the first electrode 110 is in contact with the organic layer 130 in the first organic light-emitting element. Hereinafter, the first organic light-emitting element will be simply referred to as a first organic element, and the second organic light-emitting element will be simply referred to as a second organic element. In the second organic element, on the other hand, one surface of the first electrode 110 adjacent to the light emitting layer 133 is entirely covered with the second insulating layer 120, and the first electrode 110 is not in direct contact with the organic layer 130. Therefore, the electrical resistance between the first electrode 110 and the light emitting layer 133 of the organic layer 130 in the second organic element is higher than the electrical resistance between the first electrode 110 and the light emitting layer 133 of the organic layer 130 in the first organic element.

Accordingly, in the light emitting device 1, a light-emitting threshold voltage for the second organic element is higher than a light-emitting threshold voltage for the first organic element. Organic light-emitting elements, such as the first organic element and the second organic element, do not emit light when a voltage applied across the first electrode 110 and the second electrode 140 is less than a predetermined value, and emit light when the voltage reaches the predetermined value or more and current flows between the electrodes. The light-emitting threshold voltage, described above, refers to a voltage applied across electrodes when the organic light-emitting element begins to emit light. That is, the second organic element is configured to emit light less easily than the first organic element.

Therefore, even if a voltage is accidentally applied to the first electrode 110 of the second organic element (dummy element 301) in the dummy region 30, it is possible to prevent current from flowing between the first electrode 110 and the light emitting layer 133 of the organic layer 130. The second organic element does not emit light when a voltage accidentally applied across the electrodes of the second organic element is below the light-emitting threshold voltage. Elements not contributing to image display and not supposed to emit light are thus prevented from accidentally emitting light. The first electrode 110 of the dummy element 301 is not provided with the plug 103 thereunder and thus is electrically floated. It is therefore basically unlikely that a voltage will be applied to the first electrode 110 of the dummy element 301. However, if there is a circuit layer (e.g., power supply line) with a large line width under the first electrode 110, manufacturing errors or aging may cause the first electrode 110 and the circuit layer to be accidentally electrically connected. Even in the event of accidental application of a voltage, however, the present embodiment can prevent light emission in the dummy region 30. A high level of display quality is thus achievable.

In the light emitting device 1, the first electrode 110 of the second organic element (dummy element 301) in the dummy region 30 is not provided with the plug 103 thereunder and thus is electrically floated. This creates space that allows free layout of a circuit layer under the first electrode 110. Thus, for example, the peripheral circuit 40 can be partially placed under the first electrode 110 of the dummy element 301. This allows the dummy region 30 and the peripheral circuit 40 to overlap in plan view, and reduces the chip size of the light emitting device 1.

FIG. 2 illustrates an example where the power supply line 107 is disposed under the first electrode 110 of the dummy element 301. The power supply line 107 is not electrically connected to the first electrode 110 of the dummy element 301. That is, the light emitting device 1 includes a wiring layer (power supply line 107) not electrically connected to the first electrode 110 of the dummy element 301, and includes the interlayer insulating layer 102 between the first electrode 110 and the wiring layer (power supply line 107). In this case, the line width of the power supply line 107 in plan view can be made greater than the line width of wires placed in the display region 20 in plan view. This allows, for example, large current to flow at low current density. Although the power supply line 107 is illustrated as being as wide as one dummy element 301 in FIG. 2, the line width of the power supply line 107 is not limited to this. The power supply line 107 may be widened to extend across a plurality of pixels. This further reduces current density and extends the wire life.

In the present embodiment, the second insulating layer 120 that covers the end portion of the first electrode 110 of the light emitting element 201 in the display region 20 also covers the first electrode 110 of the dummy element 301, so that the dummy element 301 is prevented from accidentally emitting light. Therefore, without increasing the number of processing steps, the dummy element 301 is prevented from accidentally emitting light. The quality of the light emitting device 1 is thus improved without negatively affecting the cost and production capacity.

(Modification)

Figure 5:
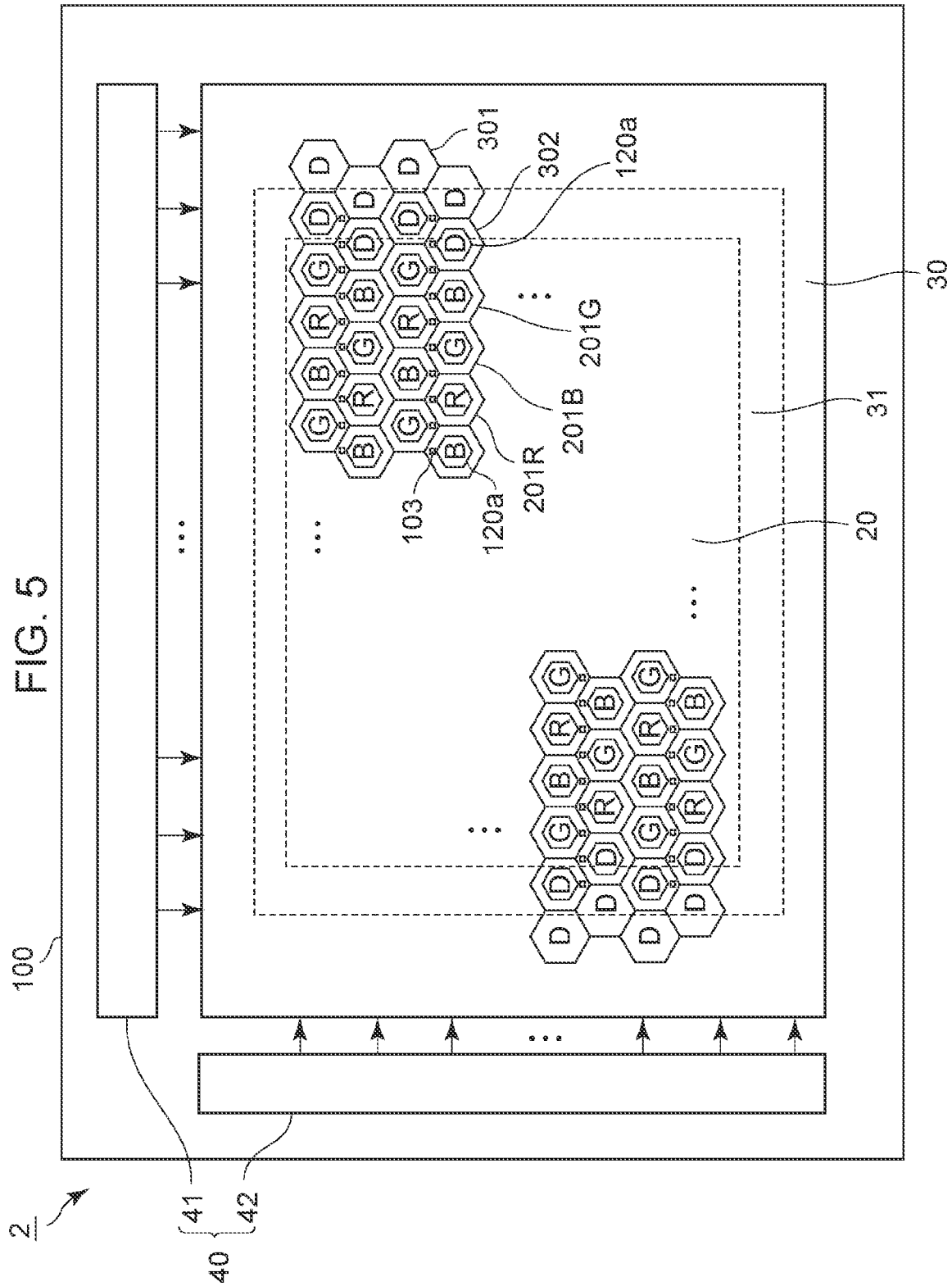
FIG. 5 is a plan view illustrating a configuration of a light emitting device according to a modification of the first embodiment.

FIG. 5 is a plan view illustrating a configuration of a light emitting device 2 according to a modification of the first embodiment. The light emitting device 2 includes an intermediate region 31 between the display region 20 and the dummy region 30. The intermediate region 31 is a region not contributing to image display in the display region 20, and may be regarded as part of the dummy region 30. The intermediate region 31 has a two-dimensional array of dummy elements 302 therein.

The dummy elements 302 have substantially the same structure as the light emitting elements 201, and are capable of switching between emission and non-emission. The dummy elements 302 do not emit light during image display in the display region 20, and emit light during inspection of the display region 20. The dummy elements 302, which are arranged adjacent to the display region 20, are similar in structure and electrical characteristics to the light emitting elements 201 in the display region 20. When inspection is performed using the dummy elements 302, accurate inspection results are obtained. For example, by adjusting signals of the light emitting elements 201 on the basis of the inspection results described above, a highly accurate, high-quality light emitting device is provided. In the present modification, as described above, the intermediate region 31 is used as an inspection area.

The dummy elements 302 arranged in the inspection area have substantially the same structure as the light emitting elements 201. This means that the dummy elements 302 may accidentally emit light in the event of accidental application of a voltage to electrodes of the dummy elements 302. To prevent this, the number of the dummy elements 302 is minimized in the present modification. For example, the display region 20 has therearound the intermediate region 31 for only several pixels. The intermediate region 31 may be as wide as, for example, five pixels or less. The dummy region 30 is disposed outside the intermediate region 31. The light emitting device 2 is thus provided, which is capable of not only preventing accidental light emission, but also allowing inspection of the light emitting elements 201 in the display region 20 using pixels around the display region 20.

Second Embodiment

Figure 6:
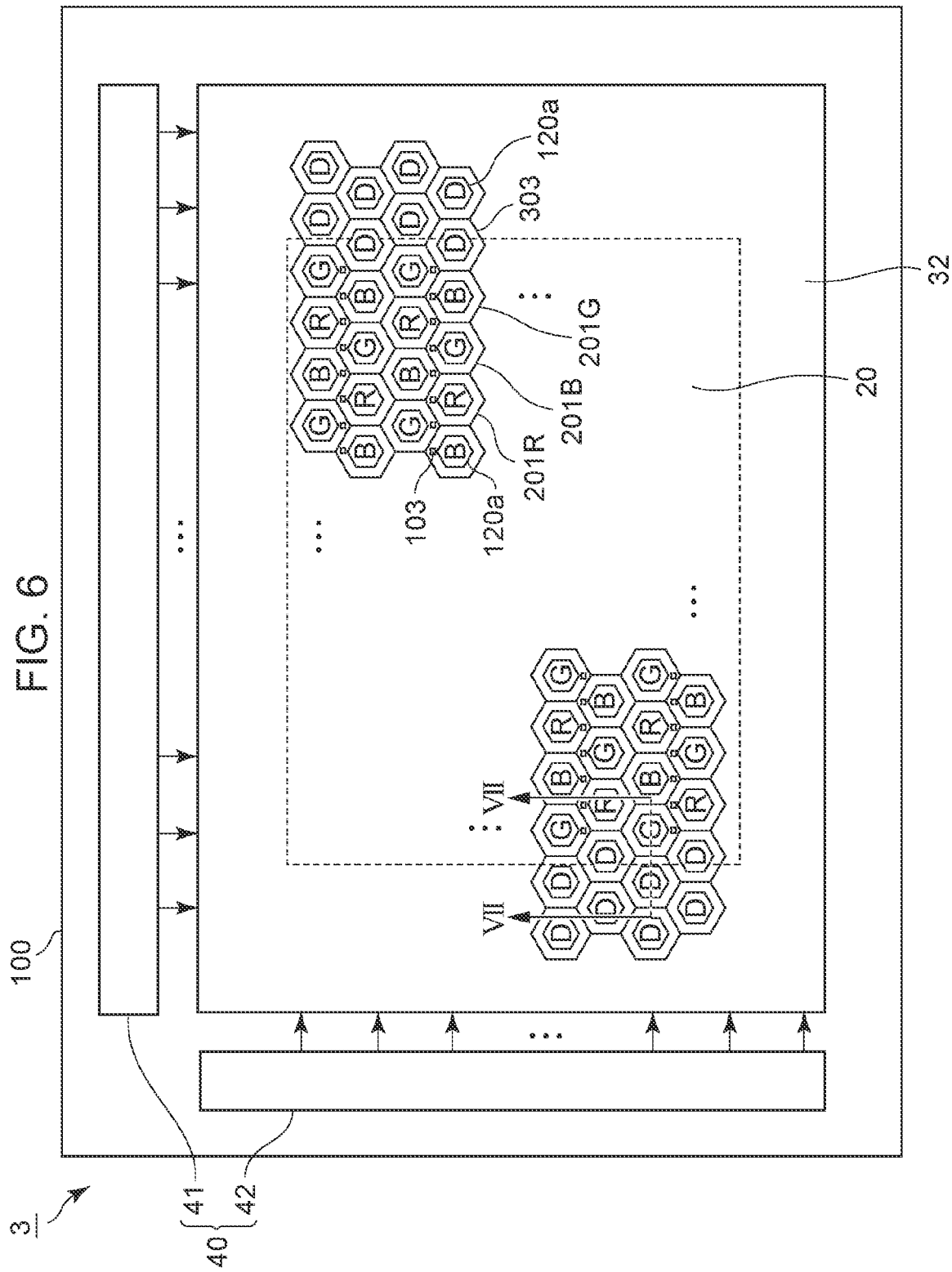
FIG. 6 is a plan view illustrating a configuration of a light emitting device according to a second embodiment.
Figure 7:
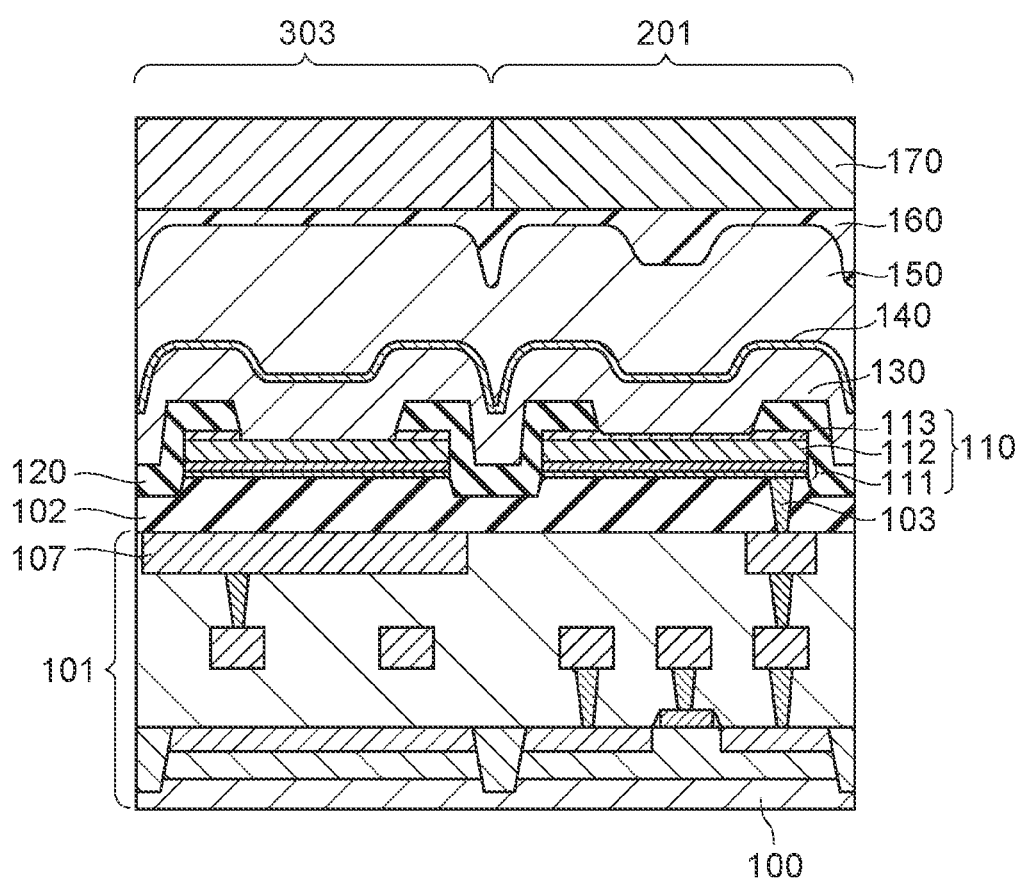
FIG. 7 is a cross-sectional schematic view of the light emitting device according to the second embodiment.
Figure 8:
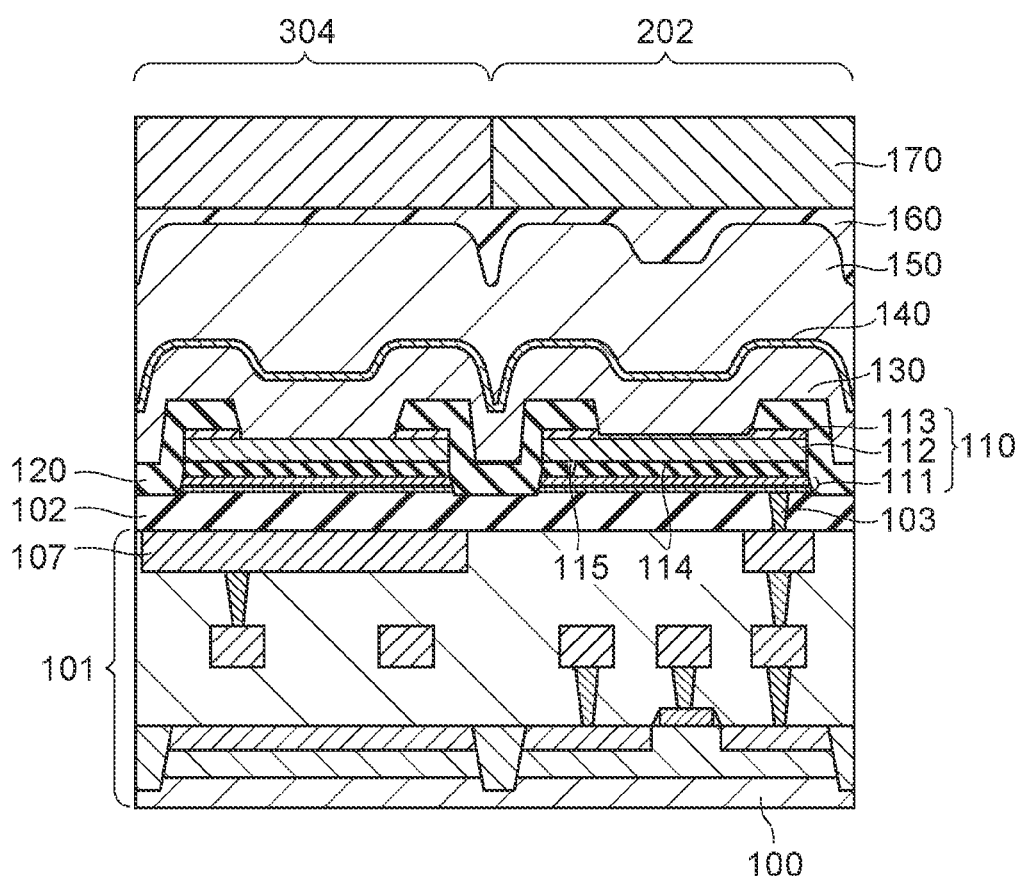
FIG. 8 is a cross-sectional schematic view of a light emitting device according to a modification of the second embodiment.

With reference to FIGS. 6 to 8, a light emitting device according to a second embodiment of the present disclosure will be described. The following description primarily refers to differences from the first embodiment.

FIG. 6 is a plan view illustrating a configuration of a light emitting device 3 according to the present embodiment. The light emitting device 3 includes the display region 20 for displaying an image, and a dummy region 32 not displaying an image. The display region 20 has the light emitting elements 201 (201R, 201G, and 201B) arranged therein, and the dummy region 32 has a plurality of dummy elements 303 arranged therein. The light emitting elements 201 and the dummy elements 303 are arranged in a two-dimensional array on the substrate 100.

Although the display region 20 is surrounded by the dummy region 30 in the light emitting device 1 of the first embodiment, the display region 20 is surrounded by the dummy region 32, not by the dummy region 30, in the light emitting device 3 of the present embodiment. The display region 20 may be partially surrounded by the dummy region 32.

As illustrated in FIG. 6, the light emitting element 201 in the display region 20 has the opening 120a in the second insulating layer 120 for defining the light emitting region. The dummy element 303 in the dummy region 32 also has the opening 120a in the second insulating layer 120. Although the light emitting element 201 in the display region 20 has the plug 103 for electrical connection to the pixel drive circuit, the dummy element 303 in the dummy region 32 does not have the plug 103.

FIG. 7 is a cross-sectional schematic view illustrating a boundary between the display region 20 and the dummy region 32 of the light emitting device 3 illustrated in FIG. 6. That is, FIG. 7 is a cross-sectional schematic view taken along line VII-VII in FIG. 6 and illustrating the light emitting element 201 and the dummy element 303 adjacent to each other.

As illustrated in FIG. 7, like the light emitting element 201, the dummy element 303 has the opening 120a in the second insulating layer 120 and this allows direct contact of the first electrode 110 and the organic layer 130. Note, however, that although the light transmitting electrode 113 of the first electrode 110 is in contact with the organic layer 130 in the light emitting element 201, the reflective metal layer 112 of the first electrode 110 is in contact with the organic layer 130 in the dummy element 303. That is, in the dummy element 303, the light transmitting electrode 113 is removed at a portion of the first electrode 110 corresponding to the opening 120a in the second insulating layer 120.

In the present embodiment, the light transmitting electrode 113 is a transparent layer with electrical resistance lower than the electrical resistance of a coating that can be formed on the surface of the reflective metal layer 112. With the light transmitting electrode 113 disposed on the reflective metal layer 112, the electrical resistance between the first electrode 110 and the organic layer 130 is reduced. If, for example, the reflective metal layer 112 is made of aluminum or aluminum alloy and exposed at the top of the first electrode 110, the surface of the reflective metal layer 112 is easily oxidized and coated with an insulating aluminum oxide film. Therefore, the electrical resistance on the surface of the first electrode 110 is high in the region where the light transmitting electrode 113 is absent.

That is, in the first organic element (light emitting element 201) of the light emitting device 3 according to the present embodiment, the light transmitting electrode 113 of low resistance constituting the top layer of the first electrode 110 is in contact with the organic layer 130. In the second organic element (dummy element 303), on the other hand, a layer of higher resistance than the light transmitting electrode 113 is formed at the top of the first electrode 110 and is in contact with the organic layer 130. Thus, the electrical resistance between the first electrode 110 and the light emitting layer 133 of the organic layer 130 in the second organic element is higher than the electrical resistance between the first electrode 110 and the light emitting layer 133 of the organic layer 130 in the first organic element.

As described above, the light transmitting electrode 113 may have the function of ensuring hole injection performance (carrier injection performance). By removing the light transmitting electrode 113 in the second organic element, the performance of carrier injection from the first electrode 110 into the light emitting layer 133 in the second organic element can be made lower than the performance of carrier injection from the first electrode 110 into the light emitting layer 133 in the first organic element.

This makes a voltage required for light emission in the second organic element (dummy element 303) higher than that in the first organic element (light emitting element 201). That is, in the light emitting device 3, a light-emitting threshold voltage for the second organic element is higher than a light-emitting threshold voltage for the first organic element. Therefore, even if a voltage is accidentally applied to the first electrode 110 of the second organic element (dummy element 303) in the dummy region 32, it is possible to prevent light emission caused by flow of current between the first electrode 110 and the light emitting layer 133 of the organic layer 130. Elements not contributing to image display and not supposed to emit light are thus prevented from accidentally emitting light.

In the present embodiment, the dummy element 303 in the dummy region 32, which does not contribute to image display, has the opening 120a in the second insulating layer 120, like the light emitting element 201 in the display region 20. It is still possible, however, to prevent the dummy element 303 from accidentally emitting light. This makes the appearance of the dummy element 303 in the dummy region 32 closer to the light emitting element 201 in the display region 20. It is thus possible to make the boundary between the display region 20 and the dummy region 32 less noticeable in appearance, prevent accidental light emission of the dummy elements 303 while keeping the seamless appearance, and provide high display quality.

FIG. 8 is a cross-sectional schematic view of the light-emitting element 202 and a dummy element 304 adjacent to each other in a light emitting device according to a modification of the second embodiment. In the present modification, the light emitting element 201 in the display region 20 of the light emitting device 3 according to the second embodiment is replaced by the light-emitting element 202, and the dummy element 303 in the dummy region 32 of the light emitting device 3 is replaced by the dummy element 304.

The present modification differs from the second embodiment in the configuration of the first electrode 110. In both the light-emitting element 202 and the dummy element 304, the first electrode 110 includes a light-transmitting insulating layer 114 interposed between the barrier metal 111 and the reflective metal layer 112. In other words, in both the light-emitting element 202 and the dummy element 304, the first electrode 110 has a multilayer structure that includes, in order from the side of the substrate 100, the barrier metal 111, the light-transmitting insulating layer 114, and the reflective metal layer 112. In the first electrode 110 of the light-emitting element 202, the barrier metal 111 and the reflective metal layer 112 are electrically connected by the plug 115 penetrating the light-transmitting insulating layer 114. On the other hand, the first electrode 110 of the dummy element 304 does not have the plug 115, and the light-transmitting insulating layer 114 electrically insulates the reflective metal layer 112 from the barrier metal 111. Therefore, the electrical resistance between the barrier metal 111 and the light emitting layer 133 of the second organic element (dummy element 304) is higher than the electrical resistance between the barrier metal 111 and the light emitting layer 133 of the first organic element (light-emitting element 202). Thus, a light-emitting threshold voltage for the second organic element is higher than a light-emitting threshold voltage for the first organic element, and the difference between the light-emitting threshold voltage for the second organic light-emitting element and the light-emitting threshold voltage for the first organic light-emitting element can be made greater than that in the light emitting device 2. The light emitting device 3 thus further effectively prevents accidental light emission of the dummy elements 304.

Third Embodiment

Figure 9:
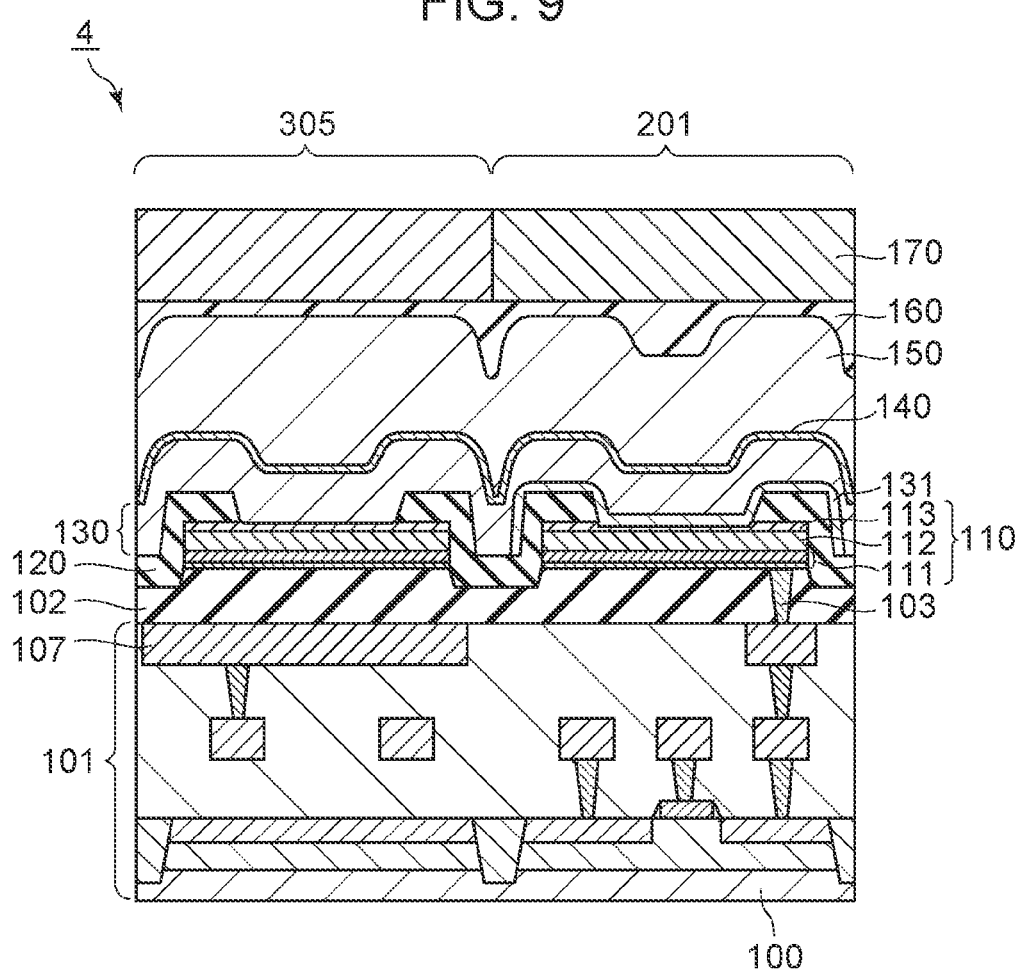
FIG. 9 is a cross-sectional schematic view of a light emitting device according to a third embodiment.

With reference to FIG. 9, a light emitting device according to a third embodiment of the present disclosure will be described. The following description primarily refers to differences from the first and second embodiments.

A light emitting device 4 according to the present embodiment includes a dummy element 305, instead of the dummy element 303 of the light emitting device 2 according to the second embodiment. FIG. 9 is a cross-sectional schematic view of the light emitting element 201 and the dummy element 305 adjacent to each other.

The light emitting element 201 of the present embodiment has the same configuration as that of the second embodiment. Like the dummy element 303 of the second embodiment, the dummy element 305 of the present embodiment has the opening 120a in the second insulating layer 120.

Unlike the dummy element 303, however, the light transmitting electrode 113 in the first electrode 110 of the dummy element 305 is kept unremoved, as in the light emitting element 201. That is, in the present embodiment, the light emitting element 201 and the dummy element 305 have the same configuration in terms of the second insulating layer 120 and the first electrode 110.

The difference between the light emitting element 201 and the dummy element 305 in the present embodiment is that although the light emitting element 201 includes the hole injection layer 131 on the first electrode 110, the dummy element 305 does not include the hole injection layer 131 on the first electrode 110. That is, the hole injection layer 131 is disposed on the first electrode 110 in the first organic element (light emitting element 201), and the hole transport layer 132 is disposed on the first electrode 110 in the second organic element (dummy element 305).

The hole injection layer 131 is a layer for facilitating injection of holes into the light emitting layer 133. The hole injection layer 131 may be formed, for example, using a compound having a highest occupied molecular orbital (HOMO) level between the work function of the first electrode 110 (light transmitting electrode 113) and the HOMO level of the hole transport layer 132. In the dummy element 305, which does not include the hole injection layer 131, the difference between the work function of the first electrode 110 and the HOMO level of a sublayer (or portion) of the organic layer 130 in contact with the first electrode 110 is greater than that in the light emitting element 201. In other words, in the dummy element 305, there is a larger barrier to hole injection from the first electrode 110 into the organic layer 130 (or hole transport layer 132 in contact with the first electrode 110 here). This means that the performance of carrier injection from the first electrode 110 into the light emitting layer 133 in the dummy element 305 is lower than the performance of carrier injection from the first electrode 110 into the light emitting layer 133 in the light emitting element 201. The hole injection layer 131 may be formed using a compound (e.g., hexaazatriphenylene hexacarbonitrile or HAT-CN) that has an electron withdrawing group, such as a cyano or halogen group, and exhibits electron acceptability to the hole transport layer 132. In this case, again, since the dummy element 305 does not include the hole injection layer 131, the performance of carrier injection from the first electrode 110 into the light emitting layer 133 in the dummy element 305 is lower than the performance of carrier injection from the first electrode 110 into the light emitting layer 133 in the light emitting element 201. As described above, in the present embodiment, the performance of carrier injection from the first electrode 110 into the light emitting layer 133 of the organic layer 130 in the second organic element is lower than the performance of carrier injection from the first electrode 110 into the light emitting layer 133 of the organic layer 130 in the first organic element.

Accordingly, a light-emitting threshold voltage for the second organic element (dummy element 305) can be made higher than a light-emitting threshold voltage for the first organic element (light emitting element 201). Therefore, even if a voltage is accidentally applied to the first electrode 110 of the second organic element (dummy element 305) in the dummy region 32, it is possible to prevent current from flowing between the first electrode 110 and the light emitting layer 133 of the organic layer 130. Elements not contributing to image display and not supposed to emit light are thus prevented from accidentally emitting light. In the present embodiment, it is possible again to make the boundary between the display region 20 and the dummy region 32 less noticeable in appearance, prevent accidental light emission of the dummy elements 305 while keeping the seamless appearance, and provide high display quality.

The light emitting device 4 is made in such a way that, in the process of sequentially depositing a plurality of sublayers of the organic layer 130 on the substrate 100, the hole injection layer 131 is formed in the display region 20 but not in the dummy region 32. The hole injection layer 131 may be selectively formed in the display region 20. For example, when a plurality of sublayers of the organic layer 130 are formed by vacuum deposition, a deposition mask with different opening layouts for the display region 20 and the dummy region 32 may be used to form the hole injection layer 131. Typically, a deposition mask with openings in the area corresponding to the display region 20 and without openings in the area corresponding to the dummy region 32 may be used. Alternatively, forming the hole injection layer 131 in both the display region 20 and the dummy region 32 may be followed by removing the hole injection layer 131 formed in the dummy region 32. When a plurality of sublayers of the organic layer 130 are formed by a printing or inkjet method, a region for forming the hole injection layer 131 may be designated such that the hole injection layer 131 is formed only in the display region 20 and not in the dummy region 32.

Although the light emitting element 201 has the hole injection layer 131 and the dummy element 305 does not have the hole injection layer 131 in in the example described above, the present disclosure is not limited to this. That is, when an organic light-emitting element having the organic layer 130 including a plurality of sublayers is formed as the light emitting element 201, the organic layer 130 of the dummy element 305 may be a layer excluding at least one of the plurality of sublayers of the organic layer 130 of the light emitting element 201. When at least one of the plurality of sublayers of the organic layer 130 of the light emitting element 201 is not formed in the dummy element 305, the level of the characteristic, such as hole injection performance or electron injection performance, of the dummy element 305 may be made lower than that of the light emitting element 201. For example, when the dummy element 305 does not have the electron injection layer 135, the performance of electron injection from the second electrode 140 into the light emitting layer 133 in the dummy element 305 may be made lower than that in the light emitting element 201. This also makes the voltage required for light emission in the second organic element (dummy element 305) higher than that in the first organic element (light emitting element 201). When the dummy element 305 does not have, for example, the light emitting layer 133, it is possible to prevent, or significantly reduce the efficiency of, light emission in the dummy element 305. With this configuration, elements not contributing to image display and not supposed to emit light are prevented from accidentally emitting light.

Other Embodiments

Figure 10:
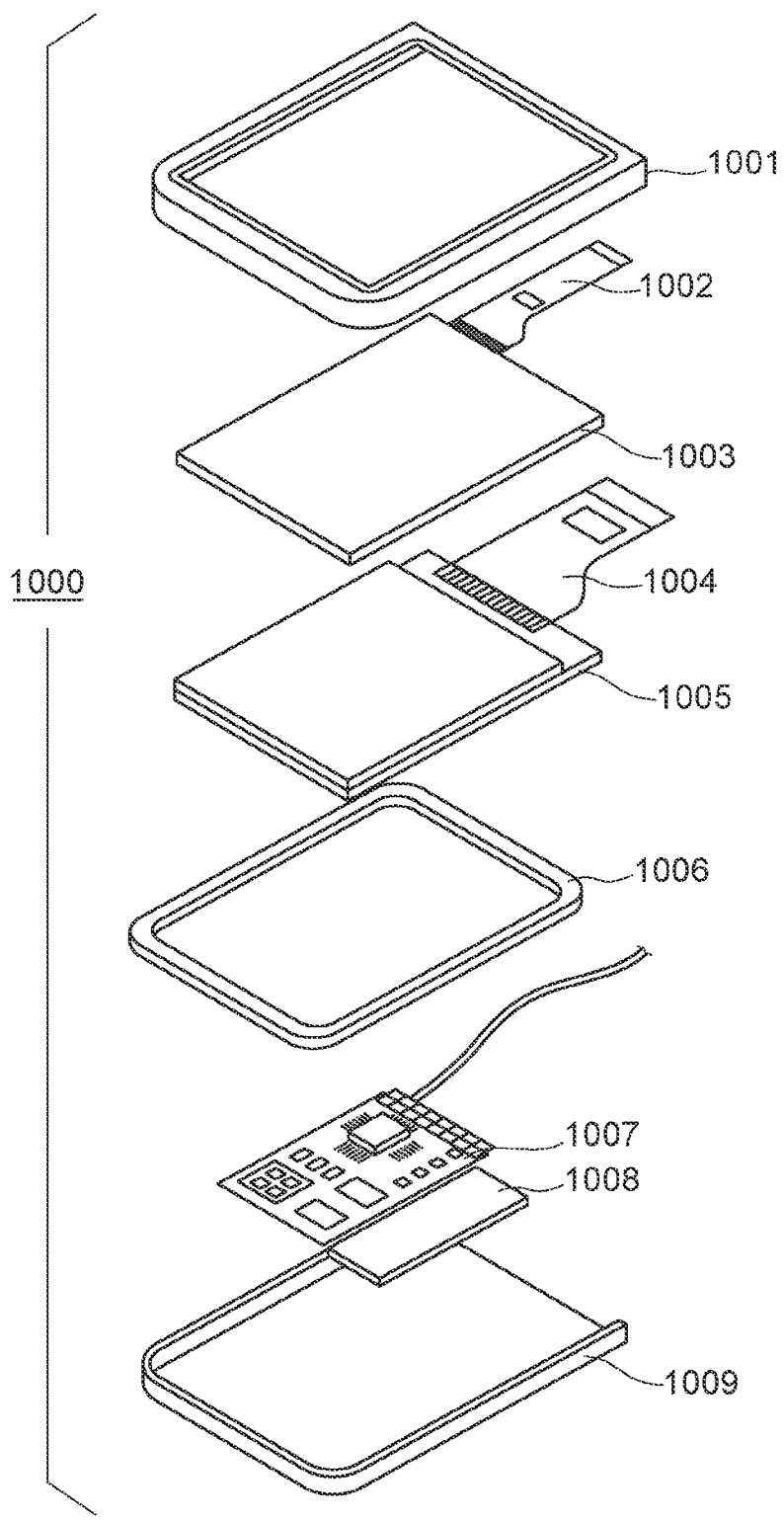
FIG. 10 is a schematic diagram of an exemplary display apparatus.

FIG. 10 is a schematic diagram of an exemplary display apparatus according to an embodiment. A display apparatus 1000 may include, between a top cover 1001 and a bottom cover 1009, a touch panel 1003, a display panel 1005, a frame 1006, a circuit board 1007, and a battery 1008. Flexible printed circuits (FPCs) 1002 and 1004 are connected to the touch panel 1003 and the display panel 1005, respectively. The circuit board 1007 has a transistor formed by printing thereon. The battery 1008 may not be provided if the display apparatus 1000 is not mobile equipment. Even when the display apparatus 1000 is mobile equipment, the battery 1008 does not need to be in the illustrated position.

The display apparatus according to the present embodiment may include color filters of red, green, and blue. The color filters of red, green, and blue may be arranged in a delta arrangement.

The display apparatus according to the present embodiment may be used as a display unit of a mobile terminal. The display apparatus may have both display and operation functions in this case. Examples of the mobile terminal include mobile phones such as smartphones, tablets, and head-mounted displays.

The display apparatus according to the present embodiment may be used as a display unit of an image capturing apparatus that includes an optical unit having a plurality of lenses, and an image sensor configured to receive light passing through the optical unit. The image capturing apparatus may include a display unit configured to display information acquired by the image sensor. The display unit may be exposed to the outside of the image capturing apparatus, or may be disposed inside a finder. The image capturing apparatus may be a digital camera, or a digital video camera.

Figure 11A:
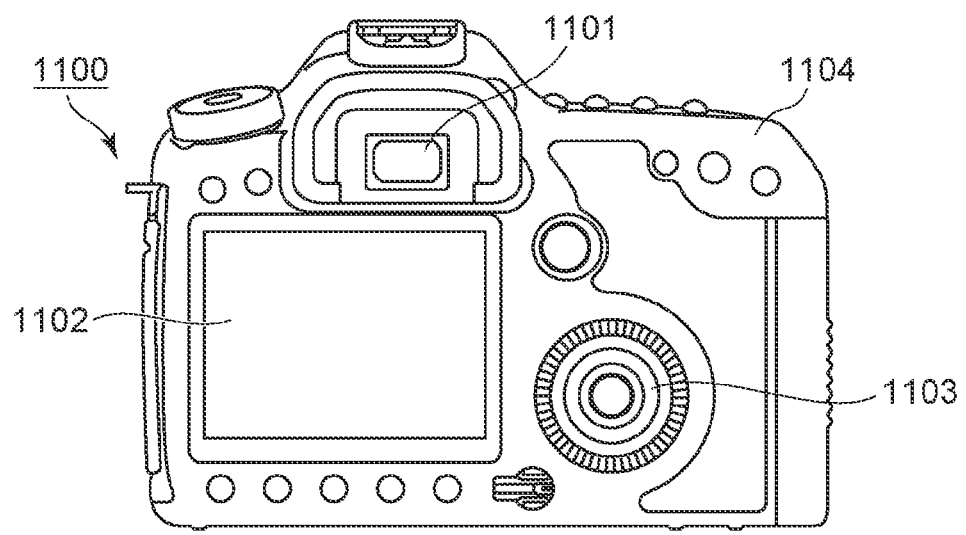
FIG. 11A is a schematic diagram of an exemplary image capturing apparatus.

FIG. 11A is a schematic diagram of an exemplary image capturing apparatus according to an embodiment. An image capturing apparatus 1100 may include a viewfinder 1101, a rear display 1102, an operation unit 1103, and a housing 1104. The viewfinder 1101 may include an organic light-emitting device according to any of the embodiments described above. In this case, the organic light-emitting device may display not only an image to be taken, but also environmental information and imaging instructions. The environmental information may include the intensity of outside light, the direction of outside light, the speed of object's movement, and the possibility that the object will be shielded by a shielding material.

Since the right time to take an image is very limited, the image should be displayed as quickly as possible. The organic light-emitting device including an organic light-emitting element according to any of the embodiments of the present disclosure may be used here, because the organic light-emitting element has a fast response speed. For faster display speed, using the organic light-emitting device including the organic light-emitting element is more suitable than using liquid-crystal display devices.

The image capturing apparatus 1100 includes an optical unit (not shown). The optical unit includes a plurality of lenses and forms an image onto an image sensor housed in the housing 1104. The focus of the plurality of lenses may be adjusted by adjusting the relative position of the lenses. This operation may be done automatically. The image capturing apparatus 1100 may be referred to as a photoelectric conversion apparatus. Instead of sequentially capturing images, the photoelectric conversion apparatus may use an imaging method which involves detecting a difference from the preceding image, or constantly extracting an image from a recorded one.

Figure 11B:
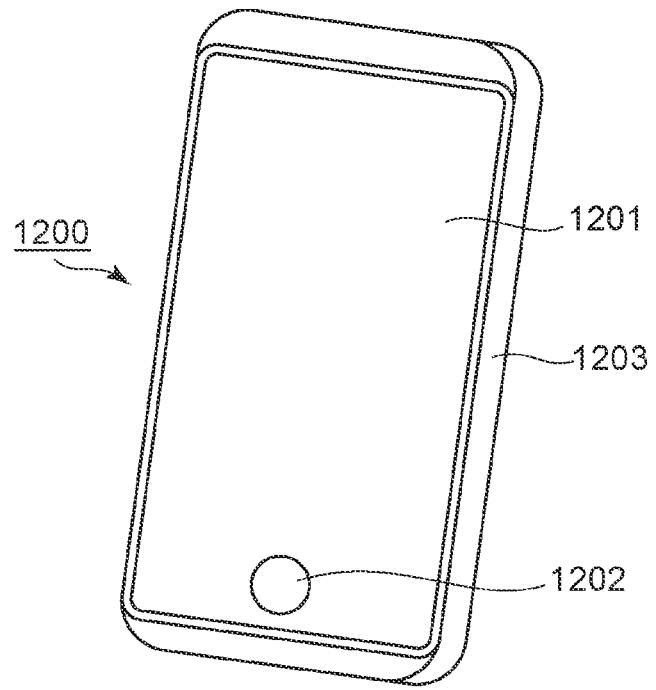
FIG. 11B is a schematic diagram of an exemplary electronic apparatus.

FIG. 11B is a schematic diagram of an exemplary electronic apparatus according to an embodiment. An electronic apparatus 1200 includes a display unit 1201, an operation unit 1202, and a housing 1203. The housing 1203 may include a circuit, a printed circuit board having the circuit, a battery, and a communicating unit. The operation unit 1202 may be a button, or a responsive unit of a touch panel type. The operation unit may be a biometric recognition unit configured to recognize, for example, a fingerprint and release the lock. The electronic apparatus including a communicating unit may be regarded as communication equipment. The electronic apparatus may include a lens and an image sensor to further provide a camera function. An image taken by the camera function is displayed by the display unit. Examples of the electronic apparatus include smartphones and notebook computers.

Figure 12A:
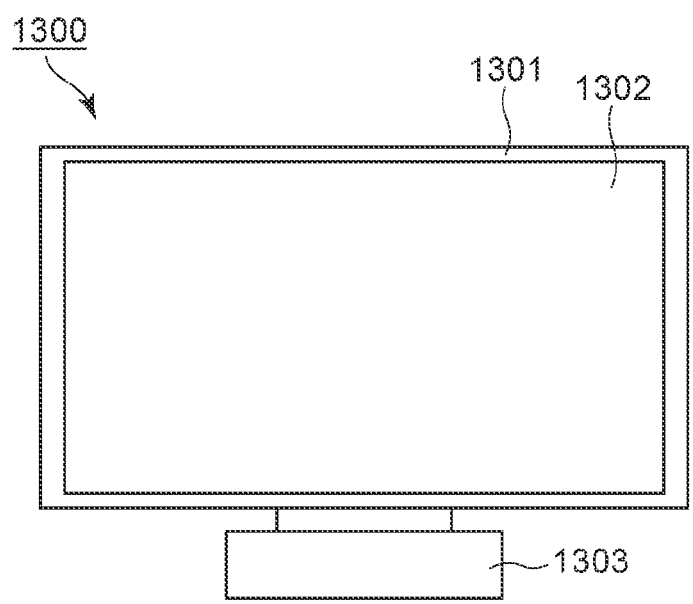
FIGS. 12A and 12B are schematic diagrams each illustrating an exemplary display apparatus.
Figure 12B:
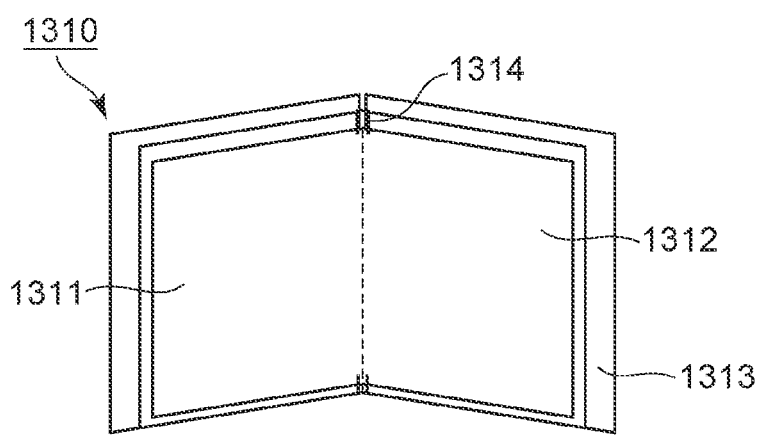

FIGS. 12A and 12B are schematic diagrams each illustrating an exemplary display apparatus according to an embodiment. The display apparatus illustrated in FIG. 12A is, for example, a television monitor or a personal computer (PC) monitor. As illustrated, a display apparatus 1300 includes a frame 1301 and a display unit 1302. An organic light-emitting device according to any of the embodiments described above may be used as the display unit 1302.

The display apparatus 1300 further includes a base 1303 that supports the frame 1301 and the display unit 1302. The configuration of the base 1303 is not limited to that illustrated in FIG. 12A. A lower side of the frame 1301 may serve as a base.

The frame 1301 and the display unit 1302 may bend and their radius of curvature may be greater than or equal to 5000 mm and less than or equal to 6000 mm.

FIG. 12B is a schematic diagram illustrating another exemplary display apparatus according to the present embodiment. A display apparatus 1310 illustrated in FIG. 12B is a so-called foldable display apparatus configured to be capable of folding. The display apparatus 1310 includes a first display unit 1311, a second display unit 1312, a housing 1313, and a bend point 1314. The first display unit 1311 and the second display unit 1312 may include an organic light-emitting device according to any of the embodiments described above. The first display unit 1311 and the second display unit 1312 may combine to form a single seamless display apparatus. The first display unit 1311 and the second display unit 1312 may be separated at the bend point 1314. The first display unit 1311 and the second display unit 1312 may each display a different image, or may display a single image together.

Figure 13A:
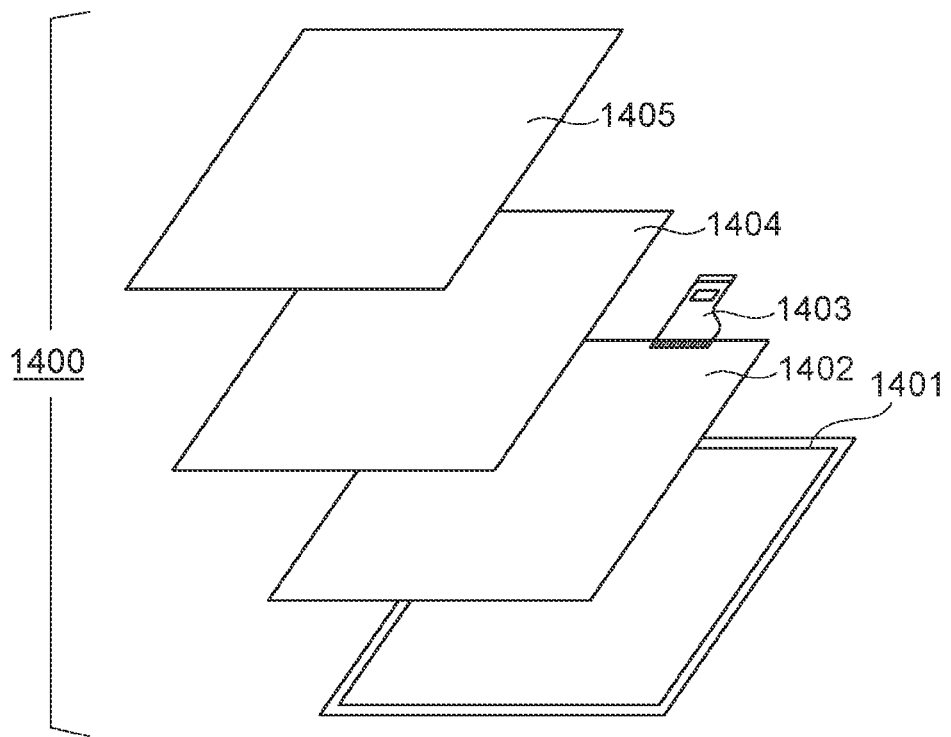
FIG. 13A is a schematic diagram of an exemplary illuminating apparatus.

FIG. 13A is a schematic diagram of an exemplary illuminating apparatus according to an embodiment. An illuminating apparatus 1400 may include a housing 1401, a light source 1402, a circuit board 1403, an optical film 1404, and a light diffusing unit 1405. The light source 1402 may include an organic light-emitting device according to any of the embodiments described above. The optical film 1404 may be a film that improves color rending properties of the light source 1402. The light diffusing unit 1405 is capable of effectively diffusing light from the light source 1402 to deliver the light over a wide range when used for lighting up or other purposes. The optical film 1404 and the light diffusing unit 1405 may be disposed on the light emitting side of the illuminating apparatus 1400. The illuminating apparatus 1400 may include an outermost cover as necessary.

The illuminating apparatus is an apparatus that illuminates, for example, a room. The illuminating apparatus may be configured to emit light of white, neutral white, or any color ranging from blue to red. The illuminating apparatus may include a lighting control circuit that controls the lighting. The illuminating apparatus may include an organic light-emitting device according to any of the embodiments described above and a power supply circuit connected thereto. The power supply circuit is a circuit that converts an alternating-current voltage to a direct-current voltage. Note that white has a color temperature of 4200 K, and neutral white has a color temperature of 5000 K. The illuminating apparatus may include a color filter.

The illuminating apparatus according to the present embodiment may include a heat dissipating unit. The heat dissipating unit is configured to release heat from inside the apparatus to the outside. The heat dissipating unit may be made of, for example, a metal with a high specific heat or liquid silicon.

Figure 13B:
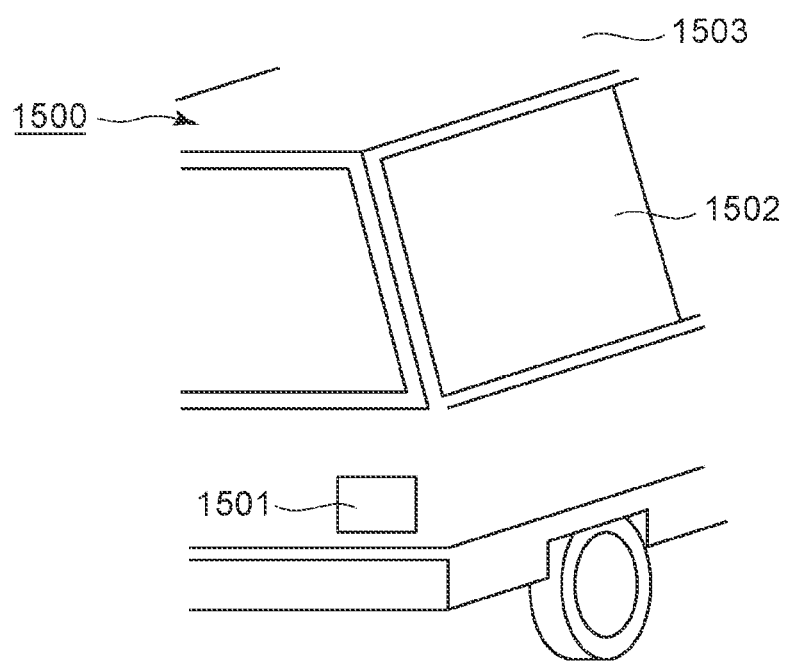
FIG. 13B is a schematic diagram of an exemplary moving object.

FIG. 13B is a schematic diagram of a car which is an exemplary moving object according to an embodiment. The car has a tail lamp which is an exemplary lighting fixture. A car 1500 has a tail lamp 1501 and may be configured to turn on the tail lamp 1501 when, for example, the brakes are applied.

The tail lamp 1501 may include an organic light-emitting device according to any of the embodiments described above. The tail lamp 1501 may include a protective member configured to protect an organic electroluminescent (EL) element. The protective member may be made of, for example, polycarbonate or any transparent material that is strong enough for the purpose. For example, a furandicarboxylic acid derivative or an acrylonitrile derivative may be mixed with the polycarbonate.

The car 1500 may include a car body 1503 and a window 1502 attached thereto. The window 1502 may be a transparent display unless it is for looking ahead of and behind the car 1500. The transparent display may include an organic light-emitting device according to any of the embodiments described above. In this case, a transparent material is used to form a component, such as an electrode, of the organic light-emitting device.

The moving object according to the present embodiment may be, for example, a ship, an aircraft, or a drone. The moving object may include a body and a lighting fixture mounted thereto. The lighting fixture may emit light for indicating the location of the body. The lighting fixture includes an organic light-emitting device according to any of the embodiments described above.

Figure 14A:
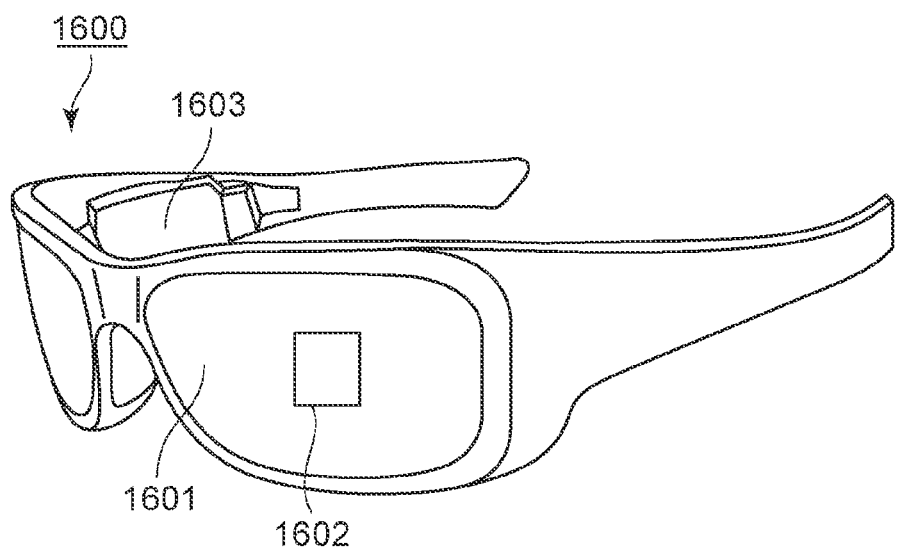
FIGS. 14A and 14B are schematic diagrams each illustrating an application of an organic light-emitting device.
Figure 14B:
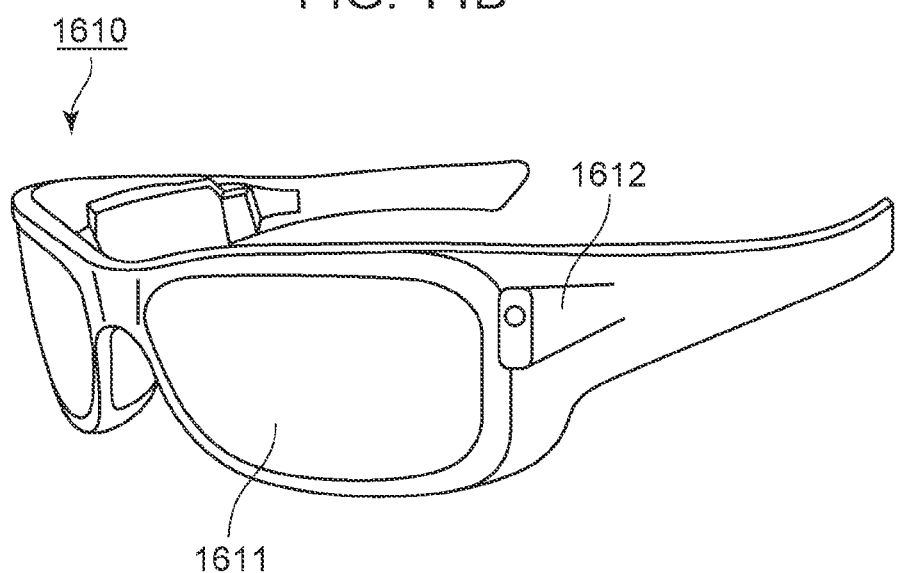

With reference to FIGS. 14A and 14B, applications of an organic light-emitting device according to any of the aforementioned embodiments will be described. For example, the organic light-emitting device is applicable to systems that can be worn as wearable devices, such as smart glasses, head-mounted displays (HMDs), and smart contact lenses. An imaging and display apparatus used in such applications include an image capturing apparatus capable of photoelectric conversion of visible light, and a display unit (organic light-emitting device) capable of emitting visible light.

FIG. 14A illustrates eyeglasses 1600 (smart glasses) as an application. An image capturing apparatus 1602, such as a complementary metal-oxide semiconductor (CMOS) sensor or a single photon avalanche diode (SPAD), is disposed on the front surface of a lens 1601 of the eyeglasses 1600, and an organic light-emitting device according to any of the aforementioned embodiments (hereinafter referred to as "display unit") is disposed on the back surface of the lens 1601.

The eyeglasses 1600 further includes a controller 1603. The controller 1603 functions as a power supply that supplies power to the image capturing apparatus 1602 and the display unit. Also, the controller 1603 controls the operation of the image capturing apparatus 1602 and the display unit. The lens 1601 includes an optical system for concentrating light onto the image capturing apparatus 1602.

FIG. 14B illustrates eyeglasses 1610 (smart glasses) as another application. The eyeglasses 1610 include a controller 1612, which includes an image capturing apparatus equivalent to the image capturing apparatus 1602 and a display unit (or organic light-emitting device). The image capturing apparatus in the controller 1612 and an optical system for projecting light emitted from the display unit are formed in a lens 1611. An image is projected onto the lens 1611. The controller 1612 functions as a power supply for supplying power to the image capturing apparatus and the display unit, and controls the operation of the image capturing apparatus and the display unit. The controller 1612 may include a line-of-sight detecting unit that detects the wearer's line of sight. The line of sight may be detected using infrared light. An infrared emitting unit emits infrared light to the user's eyeballs looking at a displayed image. An imaging unit including a light receiving element detects reflected infrared light from the eyeballs to obtain a captured eyeball image. Degradation of image quality is reduced by a reducing unit that reduces light from the infrared emitting unit to the display unit in plan view.

From the captured eyeball image obtained by imaging using infrared light, the user's line of sight to the displayed image is detected. Any known technique is applicable to line-of-sight detection using the captured eyeball image. For example, a line-of-sight detecting method based on Purkinje images obtained by reflections of irradiated light from the cornea may be used.

Specifically, line-of-sight detection based on a pupil conical reflection technique is performed. By using the pupil corneal reflection technique, a line-of-sight vector representing the direction (or rotation angle) of the eyeballs is calculated on the basis of a pupil image and a Purkinje image contained in the captured eyeball image, so that the user' line of sight is detected.

A display apparatus according to an embodiment of the present disclosure may include an image capturing apparatus including a light receiving element, and may control an image displayed by the display unit (organic light-emitting device) on the basis of user's line-of-sight information from the image capturing apparatus.

Specifically, in the display apparatus, a first field-of-view region being viewed by the user and a second field-of-view region outside the first field-of-view region are determined on the basis of line-of-sight information. The first field-of-view region and the second field-of-view region may be either determined by the controller of the display apparatus, or determined by and received from an external controller. In the display region of the display apparatus, the display resolution of the first field-of-view region may be controlled to be higher than the display resolution of the second field-of-view region. That is, the resolution of the second field-of-view region may be lower than that of the first field-of-view region.

The display region includes a first display region and a second display region different from the first display region. On the basis of line-of-sight information, a high-priority region is selected from the first display region and the second display region. The first field-of-view region and the second field-of-view region may be either determined by the controller of the display apparatus, or determined by and received from an external controller. The resolution of the high-priority region may be controlled to be higher than the resolution of the region outside the high-priority region. That is, a lower-priority region may have a lower resolution.

The first field-of-view region and the high-priority region may be determined using artificial intelligence (AI). AI may be a model that is configured to estimate the angle of line of sight and the distance to the target of the line of sight from an eyeball image by using, as teacher data, the eyeball image and the actual viewing direction of the eyeballs in the image. An AI program may be included in the display apparatus, in the image capturing apparatus, or in an external device. When included in the external device, the AI program is transmitted through communications to the display apparatus.

When display control is performed on the basis of visual detection, the technique described herein is applicable to smart glasses with an image capturing apparatus that captures external images. The smart glasses can display captured external image information in real time.

As described above, apparatuses including an organic light-emitting device according to any of the aforementioned embodiments provide high-quality, stable display for a long time.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-153485 filed Sep. 14, 2020, which is hereby incorporated by reference herein in its entirety.

What is claimed is:

1. An organic light-emitting device comprising:
a display region;
a non-display region disposed around the display region;
a first organic light-emitting element disposed on a substrate and included in the display region; and
a second organic light-emitting element disposed on the substrate and included in the non-display region,
wherein
the first organic light-emitting element and the second organic light-emitting element each include, in an order from a side of the substrate, a first electrode, an organic layer including a light emitting layer, and a second electrode; and
a light-emitting threshold voltage for the second organic light-emitting element is higher than a light-emitting threshold voltage for the first organic light-emitting element.

2. The organic light-emitting device according to claim 1, wherein an electrical resistance between the first electrode and the light emitting layer in the second organic light-emitting element is higher than an electrical resistance between the first electrode and the light emitting layer in the first organic light-emitting element.

3. The organic light-emitting device according to claim 1, wherein performance of carrier injection from the first electrode or the second electrode into the light emitting layer in the second organic light-emitting element is lower than performance of carrier injection from the first electrode or the second electrode into the light emitting layer in the first organic light-emitting element.

4. The organic light-emitting device according to claim 1, wherein
the organic layer of the first organic light-emitting element includes at least one layer selected from a hole injection layer, a hole transport layer, an electron transport layer, and an electron injection layer, and
the organic layer of the second organic light-emitting element does not include the at least one layer.

5. The organic light-emitting device according to claim 1, wherein
the organic layer of the first organic light-emitting element includes a hole injection layer, and
the organic layer of the second organic light-emitting element does not include a hole injection layer.

6. The organic light-emitting device according to claim 1, wherein
the organic layer of the first organic light-emitting element includes an electron injection layer, and
the organic layer of the second organic light-emitting element does not include an electron injection layer.

7. The organic light-emitting device according to claim 1, wherein an entire surface of the first electrode of the second organic light-emitting element is covered with an insulating layer, the entire surface being a side of the first electrode facing the light emitting layer.

8. The organic light-emitting device according to claim 1, wherein the first electrode of the second organic light-emitting element is not in direct contact with the organic layer.

9. The organic light-emitting device according to claim 1, wherein an electrical resistance on a surface of the first electrode of the second organic light-emitting element is higher than an electrical resistance on a surface of the first electrode of the first organic light-emitting element.

10. The organic light-emitting device according to claim 1, wherein the first electrode of the second organic light-emitting element is electrically floated.

11. The organic light-emitting device according to claim 1, further comprising:
a wiring layer; and
an interlayer insulating layer interposed between the first electrode and the wiring layer,
wherein the wiring layer is not electrically connected to the first electrode of the second organic light emitting element.

12. The organic light-emitting device according to claim 1, wherein the first organic light-emitting element is disposed in an area of the non-display region, the area being adjacent to the display region.

13. The organic light-emitting device according to claim 1, wherein the display region includes a plurality of display pixels, and at least one of the plurality of display pixels includes the first organic light-emitting element and a transistor connected to the first organic light-emitting element.

14. A display apparatus comprising:
an image capturing apparatus; and
the organic light-emitting device according to claim 1 serving as a display unit,
wherein an image displayed by the display unit is controlled on the basis of user's line-of-sight information received from the image capturing apparatus.

15. A photoelectric conversion apparatus comprising:
an optical unit including a plurality of lenses;
an image sensor configured to receive light passing through the optical unit; and
a display unit configured to display an image acquired by the image sensor,
wherein the display unit includes the organic light-emitting device according to claim 1.

16. An electronic apparatus comprising:
a display unit including the organic light-emitting device according to claim 1;
a housing having the display unit; and
a communicating unit included in the housing and configured to communicate with an external device.

17. A illuminating apparatus comprising:
a light source including the organic light-emitting device according to claim 1; and a light diffusing unit or optical film configured to transmit light emitted by the light source.

18. A moving object comprising:
a lighting fixture including the organic light-emitting device according to claim 1; and
a body having the lighting fixture.

19. The organic light-emitting device according to claim 1, wherein the light emitting layer is common to and extends across the first organic light-emitting element and the second organic light-emitting element.

20. An organic light-emitting device comprising:
a display region;
a non-display region disposed around the display region;
a first organic light-emitting element disposed on a substrate and included in the display region; and
a second organic light-emitting element disposed on the substrate and included in the non-display region,
wherein the first organic light-emitting element and the second organic light-emitting element each include, in an order from a side of the substrate, a first electrode, an organic layer including a light emitting layer, and a second electrode; and
an entire surface of the first electrode of the second organic light-emitting element is covered with an insulating layer, the entire surface being a side of the first electrode facing the light emitting layer.

21. The organic light-emitting device according to claim 20, further comprising:
a wiring layer; and
an interlayer insulating layer interposed between the first electrode and the wiring layer,
wherein the wiring layer is not electrically connected to the first electrode of the second organic light emitting element.

22. The organic light-emitting device according to claim 20, wherein the first organic light-emitting element is disposed in an area of the non-display region adjacent to the display region.

23. An organic light-emitting device comprising:
a display region;
a non-display region disposed around the display region;
a first organic light-emitting element disposed on a substrate and included in the display region; and
a second organic light-emitting element disposed on the substrate and included in the non-display region,
wherein
the first organic light-emitting element and the second organic light-emitting element each include, in an order from a side of the substrate, a first electrode, an organic layer, and a second electrode;
the organic layer of the first organic light-emitting element includes a light emitting layer; and
the organic layer of the second organic light-emitting element does not include a light emitting layer.

24. The organic light-emitting device according to claim 23, further comprising:
a wiring layer; and
an interlayer insulating layer interposed between the first electrode and the wiring layer,
wherein the wiring layer is not electrically connected to the first electrode of the second organic light emitting element.

25. The organic light-emitting device according to claim 23, wherein the first organic light-emitting element is disposed in an area of the non-display region adjacent to the display region.

* * * * *